United States Patent
Cho et al.

(10) Patent No.: US 12,224,306 B2
(45) Date of Patent: Feb. 11, 2025

(54) PIXEL AND DISPLAY DEVICE INCLUDING THE SAME

(71) Applicant: Samsung Display Co., LTD., Yongin-si (KR)

(72) Inventors: Eun A Cho, Yongin-si (KR); Jong Hyuk Kang, Yongin-si (KR); Won Ho Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 670 days.

(21) Appl. No.: 17/395,804

(22) Filed: Aug. 6, 2021

(65) Prior Publication Data
US 2022/0181383 A1    Jun. 9, 2022

(30) Foreign Application Priority Data

Dec. 7, 2020 (KR) .................. 10-2020-0169886

(51) Int. Cl.
*H01L 27/15* (2006.01)
*H01L 29/786* (2006.01)
(Continued)

(52) U.S. Cl.
CPC ...... *H01L 27/156* (2013.01); *H01L 29/78633* (2013.01); *H01L 33/24* (2013.01); *H01L 33/38* (2013.01)

(58) Field of Classification Search
CPC . H01L 27/156; H01L 29/78633; H01L 33/24; H01L 25/167; H01L 25/0753;
(Continued)

(56) References Cited

U.S. PATENT DOCUMENTS 9,773,761 B2    9/2017  Do
10,818,647 B2   10/2020 Kim et al.
(Continued)

FOREIGN PATENT DOCUMENTS

KR     10-1490758      2/2015
KR    10-2018-0007025  1/2018
(Continued)

OTHER PUBLICATIONS

International Search Report corresponding to International Application No. PCT/KR2021/012522 dated Dec. 27, 2021.

*Primary Examiner* — Cuong B Nguyen
(74) *Attorney, Agent, or Firm* — KILE PARK REED & HOUTTEMAN PLLC

(57) ABSTRACT

A pixel includes a light emitting area including a central portion and an outer portion, a non-light emitting area surrounding the light emitting area, a first electrode and a second electrode that are spaced apart from each other in the light emitting area, and a first light emitting element disposed between the first electrode and the second electrode. The first electrode and the second electrode are spaced apart from each other at a first interval in the central portion, and are spaced apart from each other at a second interval in the outer portion. The second interval is larger than the first interval. An interval between the first electrode and the second electrode gradually increases from the central portion to the outer portion.

20 Claims, 19 Drawing Sheets

(51) Int. Cl.
*H01L 33/24* (2010.01)
*H01L 33/38* (2010.01)

(58) Field of Classification Search
CPC ................ H01L 33/62; H01L 27/1214; H01L 33/38–387; H01L 27/153
See application file for complete search history.

(56) References Cited

U.S. PATENT DOCUMENTS

2018/0012876 A1* 1/2018 Kim ................ H01L 33/387
2021/0288033 A1 9/2021 Lim et al.

FOREIGN PATENT DOCUMENTS

| | | |
|---|---|---|
| KR | 10-2020-0006208 | 1/2020 |
| KR | 10-2020-0041429 | 4/2020 |
| KR | 10-2020-0085977 | 7/2020 |
| KR | 10-2020-0088962 | 7/2020 |
| WO | 2015/005655 | 1/2015 |

\* cited by examiner

PIXEL AND DISPLAY DEVICE INCLUDING THE SAME

CROSS-REFERENCE TO RELATED APPLICATION(S)

This application claims priority to and the benefit of Korean Patent Application No. 10-2020-0169886 under 35 U.S.C. § 119, filed on Dec. 7, 2020 in the Korean Intellectual Property Office, the entire contents of which are incorporated herein by reference.

BACKGROUND

1. Technical Field

The embodiments relate to a pixel and a display device including pixels.

2. Description of the Related Art

Recently, interest in an information display is increasing. Accordingly, research and development on display devices have been continuously conducted.

SUMMARY

The embodiments provide a pixel including a light emitting element and a display device including the same.

A pixel according to an embodiment may include a light emitting area including a central portion and an outer portion, a non-light emitting area surrounding the light emitting area, a first electrode and a second electrode that are spaced apart from each other in the light emitting area; and a first light emitting element disposed between the first electrode and the second electrode. The first electrode and the second electrode may be spaced apart from each other at a first interval in the central portion. The first electrode and the second electrode may be spaced apart from each other second interval in the outer portion, the second interval being larger than the first interval. An interval between the first electrode and the second electrode may gradually increase from the central portion to the outer portion.

The second interval between the first electrode and the second electrode may linearly increases in the outer portion.

The second interval between first electrode and the second electrode may nonlinearly increase in the outer portion.

The second interval between first electrode and the second electrode may vary discontinuously in the outer portion.

The first electrode and the second electrode may have shapes that are symmetrical to each other with respect to the first light emitting element.

The first electrode and the second electrode may have shapes that are symmetrical to each other with respect to the central portion.

The first electrode and the second electrode may have shapes that are symmetrical to each other with respect to the first light emitting element. Each of the first electrode and the second electrode may have a vertically symmetrical shape with respect to the central portion.

The first electrode and the second electrode may have surfaces facing each other that have diagonal shapes, curved line shapes, or step-like shapes.

The first electrode and the second electrode may be spaced apart from each other in a first direction in the light emitting area, and may extend in a second direction.

The first electrode and the second electrode may be spaced apart from each other by the first interval in the first direction in the central portion. The first electrode and the second electrode may be spaced apart from each other by the second interval than the first interval in the first direction in the outer portion. An interval between the first electrode and the second electrode in the first direction may gradually increase from the central portion to the outer portion.

The central portion may include an area corresponding to a central point of the light emitting area in the second direction, and an area extending from the central point toward the outer portion.

The first interval between the first electrode and the second electrode may have a uniform distance interval in the central portion.

The first interval between the first electrode and the second electrode may gradually increase from the central point of the light emitting area.

The first electrode and the second electrode may have surfaces, respectively facing each other, and may have constant slopes or curvatures around the central point of the light emitting area on surfaces facing each other. The first electrode and the second electrode may be spaced apart from each other at a continuously increasing interval.

The light emitting area may include an unaligned area disposed between the outer portion and the non-light emitting area. The first electrode and the second electrode may be farther spaced apart from each other in the unaligned area than in the central portion and the outer portion. The first electrode and the second electrode each may have a reduced width in the unaligned area.

The first light emitting element may be electrically connected between the first electrode and the second electrode.

The pixel may further include a third electrode and a fourth electrode that may be spaced apart from each other in the light emitting area and may be separated from the first electrode and the second electrode, and a second light emitting element disposed between the third electrode and the fourth electrode.

The third electrode and the fourth electrode may be spaced apart from each other at a third interval in the central portion. The third electrode and the fourth electrode may be spaced apart from each other at a fourth interval in the outer portion, the fourth interval being larger than the third interval. An interval between the third electrode and the fourth electrode gradually increases from the central portion to the outer portion.

The pixel may further include a first contact electrode, a second contact electrode and a third contact electrode. The first electrode may electrically connect the first electrode and a first end portion of the first light emitting element. The second contact electrode may electrically connect the second electrode, a second end portion of the first light emitting element, the third electrode, and a first end portion of the second light emitting element. The third contact electrode may electrically connect the fourth electrode and a second end portion of the second light emitting element.

A display device according to an embodiment may include a pixel disposed in a display area. The pixel may include a light emitting area including a central portion and an outer portion, a non-light emitting area surrounding the light emitting area, a first electrode and a second electrode that are spaced apart from each other in the light emitting area, and a first light emitting element disposed between the first electrode and the second electrode. The first electrode and the second electrode may be spaced apart from each other at a first interval in the central portion. The first electrode and the second electrode may be spaced apart from each other at a second interval in the outer portion, the second interval being larger than the first interval. An interval between the first electrode and the second electrode may gradually increase from the central portion to the outer portion.

Other embodiments are described in the detailed description and drawings.

According to the pixel and the display device according to the embodiments, it is possible to prevent light emitting elements from being concentrated in an outer portion of a light emitting area, and it is possible to stably align the light emitting elements between a first electrode and a second electrode. Accordingly, it is possible to increase a utilization rate of the light emitting elements and to improve light emitting characteristics of a pixel.

Effects of embodiments are not limited to those illustrated above, and other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
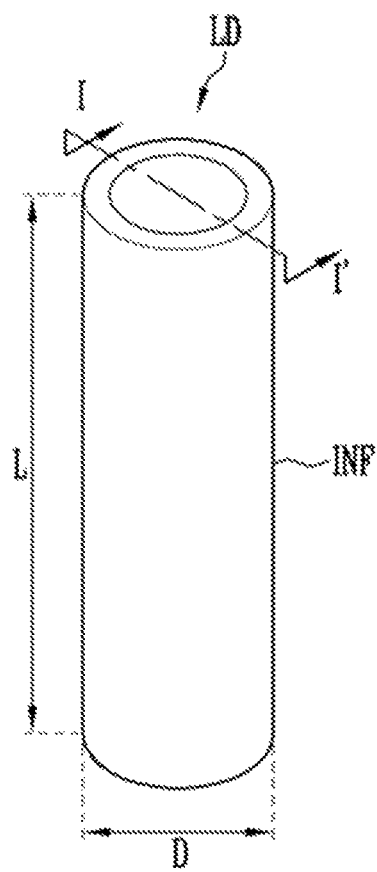
FIG. 1 illustrates a schematic perspective view of a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

Some of the elements not directly related to the features of the embodiments in the drawing may be omitted in order to clearly illustrate the embodiment. Some of the elements in the drawing can be shown in somewhat exaggerated sizes, ratios, and the like. For the same or similar elements throughout drawing, the same reference numerals and symbols are to be given as much as possible even if they are displayed on different drawings, and duplicate descriptions will be omitted.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Figure 2:
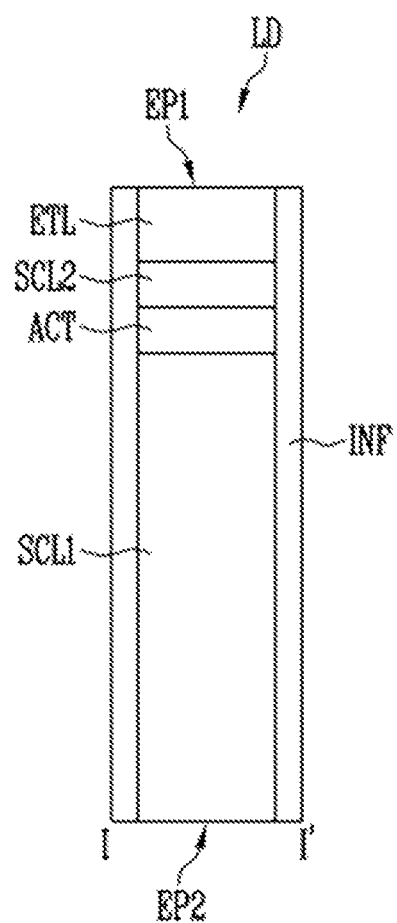
FIG. 2 illustrates a cross-sectional view of a light emitting element according to an embodiment.

FIG. 1 illustrates a schematic perspective view of a light emitting element LD according to an embodiment, and FIG. 2 illustrates a cross-sectional view of a light emitting element LD according to an embodiment. For example, FIG. 1 shows an example of the light emitting element LD that may be used as a light source of a pixel according to an embodiment, and FIG. 2 shows an example of a cross-section of the light emitting element LD taken along line I-I' of FIG. 1.

Referring to FIG. 1 and FIG. 2, the light emitting element LD includes a first semiconductor layer SCL1, an active layer ACT, a second semiconductor layer SCL2 that are sequentially disposed along one direction, and an insulating film INF covering outer circumferential surfaces (for example, side surfaces) of the first semiconductor layer SCL1, the active layer ACT, and the second semiconductor layer SCL2. The light emitting element LD may include an electrode layer ETL disposed on the second semiconductor layer SCL2. The insulating film INF may or may not cover at least a part of the outer circumferential surface of the electrode layer ETL. In some embodiments, the light emitting element LD may further include another electrode layer disposed on a surface (for example, a lower surface) of the first semiconductor layer SCL1.

In an embodiment, the light emitting element LD is provided in a rod shape extending along a direction, and may have a first end portion EP1 and a second end portion EP2 formed at respective ends of a length L direction (or thickness direction). The first end portion EP1 may be a first bottom surface (or upper surface) of the light emitting element LD, and the second end portion EP2 may be a second bottom surface (or lower surface) of the light emitting element LD.

In describing the embodiment, the "rod shape" includes a rod-like shape or bar-like shape (with an aspect ratio greater than 1) that is long in the length L direction, such as a circular cylinder or a polygonal cylinder, but the shape of the cross-section is not particularly limited. For example, the length L of the light emitting element LD may be larger than a diameter D (or a width of a lateral cross-section).

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. The first semiconductor layer SCL1 may be disposed at the second end portion EP2 of the light emitting element LD, and the electrode layer ETL may be disposed at the first end portion EP1 of the light emitting element LD. In another embodiment, at least one other electrode layer may be disposed on the second end portion EP2 of the light emitting element LD.

The first semiconductor layer SCL1 may be a first conductive semiconductor layer. For example, the first semiconductor layer SCL1 may be an N-type semiconductor layer including an N-type dopant. For example, the first semiconductor layer SCL1 may include a semiconductor material of one of InAlGaN, GaN, AlGaN, InGaN, AlN, and InN, and may include a N-type semiconductor layer doped with a dopant such as Si, Ge, Sn, or the like. However, the material included in the first semiconductor layer SCL1 is not limited thereto, and the first semiconductor layer SCL1 may be made of other materials.

The active layer ACT is disposed on the first semiconductor layer SCL1, and may be formed to have a single-quantum or multi-quantum well structure. The position of the active layer ACT may be modified according to the type of the light emitting element LD. The active layer ACT may emit light having a wavelength of about 400 nm to about 900 nm, and may have a double hetero-structure.

A clad layer (not shown) doped with a conductive dopant may be formed at an upper portion and/or a lower portion of the active layer ACT. For example, the clad layer may be formed as an AlGaN layer or an InAlGaN layer. In some embodiments, a material such as AlGaN and AlInGaN may be used to form the active layer ACT. In other embodiments, the active layer ACT may be formed of other materials.

In case that a voltage of a threshold voltage or more is applied to respective ends of the light emitting element LD, the light emitting device LD emits light while electron-hole pairs are combined in the active layer ACT. By controlling the light emission of the light emitting element LD by using this principle, the light emitting element LD may be used as a light source for other light emitting devices in addition to pixels of a display device.

The second semiconductor layer SCL2 is disposed to on the active layer ACT, and may include a second conductive type semiconductor layer different from the first semiconductor layer SCL1. For example, the second semiconductor layer SCL2 include may be a P-type semiconductor layer including a P-type dopant. For example, the second semiconductor layer SCL2 may include at least one semiconductor material of InAlGaN, GaN, AlGaN, InGaN, AlN, and InN, and may be a P-type semiconductor layer doped with a conductive dopant such as Mg. However, the material included in the second semiconductor layer SCL2 is not limited thereto, and the second semiconductor layer SCL2 may be formed of other materials.

In an embodiment, the first semiconductor layer SCL1 and the second semiconductor layer SCL2 may have different lengths (or thicknesses) in the length L direction of the light emitting element LD. For example, the first semiconductor layer SCL1 may have a longer length (or thicker thickness) than that of the second semiconductor layer SCL2 along the length L direction of the light emitting element LD. Accordingly, the active layer ACT may be disposed closer to the first end portion EP1 than to the second end portion EP2.

The electrode layer ETL may be disposed on the second semiconductor layer SCL2. The electrode layer ETL may protect the second semiconductor layer SCL2, and may be a contact electrode for easily electrically connecting the second semiconductor layer SCL2 to a predetermined electrode or wire. For example, the electrode layer ETL may be an ohmic contact electrode or a Schottky contact electrode.

In describing the embodiments, the term "connection (or coupling)" may mean a physical and/or electrical connection (or coupling). This may mean a direct or indirect connection (or coupling), and an integrated or non-integrated connection (or coupling).

The electrode layer ETL may be substantially transparent or translucent. Accordingly, light generated by the light emitting element LD may pass through the electrode layer ETL to be emitted to the outside of the light emitting element LD. In another embodiment, when light generated by the light emitting element LD is emitted to the outside of the light emitting element LD without transmitting through the electrode layer ETL, the electrode layer ETL may be formed to be opaque.

In an embodiment, the electrode layer ETL may include metal or a metal oxide. For example, the electrode layer ETL may be formed by singly using or mixing a metal such as chromium (Cr), titanium (Ti), aluminum (Al), gold (Au), nickel (Ni), or copper (Cu), and an oxide or alloy thereof; and a transparent conductive material such as an indium tin oxide (ITO), an indium zinc oxide (IZO), an indium tin zinc oxide (ITZO), a zinc oxide (ZnO), or an indium oxide ($In_2O_3$).

The insulating film INF may expose the electrode layer ETL and the first semiconductor layer SCL1 at the first and second end portions EP1 and EP2 of the light emitting element LD, respectively.

In case that the insulating film INF is provided to cover the surface of the light emitting element LD, for example, the insulating film INF covers the outer circumferential surfaces of the first semiconductor layer SCL1, the active layer ACT, the second semiconductor layer SCL2, and/or of the electrode layer ETL, short circuit defects through the light-emitting element LD may be prevented. Therefore, electrical stability of the light emitting element LD may be secured.

In case that the insulating film INF is provided on the surface of the light emitting element LD, it is possible to improve life-span and efficiency by minimizing surface defects of the light emitting element LD. The insulating film INF may also prevent short circuit defects between the light emitting elements LD from occurring even when light emitting elements LD are disposed in close contact with each other.

In an embodiment, the light emitting element LD may be manufactured through a surface treatment process. For example, when the light emitting elements LD are mixed with a fluid solution (or a solvent) and supplied to each light emitting area (for example, a light emitting area of each pixel), each light emitting element LD may be surfacetreated so that the light emitting elements LD are not non-uniformly aggregated in the solution and are uniformly distributed. In an embodiment, the insulating film INF itself may be formed as a hydrophobic film using a hydrophobic material, or a hydrophobic film made of a hydrophobic material may be additionally formed on the insulating film INF.

The insulating film INF may include a transparent insulating material.

Accordingly, light generated by the active layer ACT may transmit through the insulating film INF to be emitted to the outside of the light emitting element LD. For example, the insulating film INF may include at least one insulating material of $SiO_2$ or some other silicon oxide ($SiO_x$), $Si_3N_4$ or some other silicon nitride ($SiN_x$), $Al_2O_3$ or some other aluminum oxide ($Al_xO_y$) and $TiO_2$ or some other titanium oxide ($Ti_xO_y$) but the embodiments are not limited thereto.

The insulating film INF may be formed as a single layer or multilayer. For example, the insulating film INF may be formed as a double film.

In an embodiment, the insulating film INF may be partially etched in at least one area, for example, at least one of an upper area and a lower area. The insulating film INF may have a rounded shape in the at least one area, but the shape of the insulating film INF is not limited thereto. For example, in at least one of the upper and lower areas of the insulating film INF, the insulating film INF may be partially or entirely removed. Accordingly, the first semiconductor layer SCL1, the second semiconductor layer SCL2, the electrode layer ETL, or another electrode layer (for example, another electrode layer disposed on the second end portion EP2 of the light emitting element LD) may be partially exposed.

In an embodiment, the light emitting element LD may have a size as small as nano-scale or micro-scale. For example, the light emitting element LD may each have the diameter D (or a width of a lateral cross-section) and/or the length L ranging from a nano scale to a micro scale. For example, the light emitting element LD may have the diameter D of about several hundreds of nanometer range and the length L of about several micrometer ranges. However, the size of the light emitting element LD in the embodiment is not limited thereto. For example, the size of the light emitting element LD may be modified according to design conditions of the specific light emitting devices using the light emitting element LD as a light source.

The structure, shape, and/or type of the light emitting element LD may be changed according to embodiments. For example, the light emitting element LD may not include the electrode layer ETL. The light emitting element LD may further include another electrode layer disposed at one end portion of the first semiconductor layer SCL1. The light emitting element LD may be formed in a core-shell structure.

A light emitting device including the light emitting element LD may be used in other types of devices that require a light source in addition to a display device. For example, light emitting elements LD may be arranged in each pixel of a display panel, and the light emitting elements LD may be used as a light source of each pixel. However, applications of the light emitting element LD are not limited to the above-described example. For example, the light emitting element LD may be used in other types of devices that require a light source, such as a lighting device.

Figure 3:
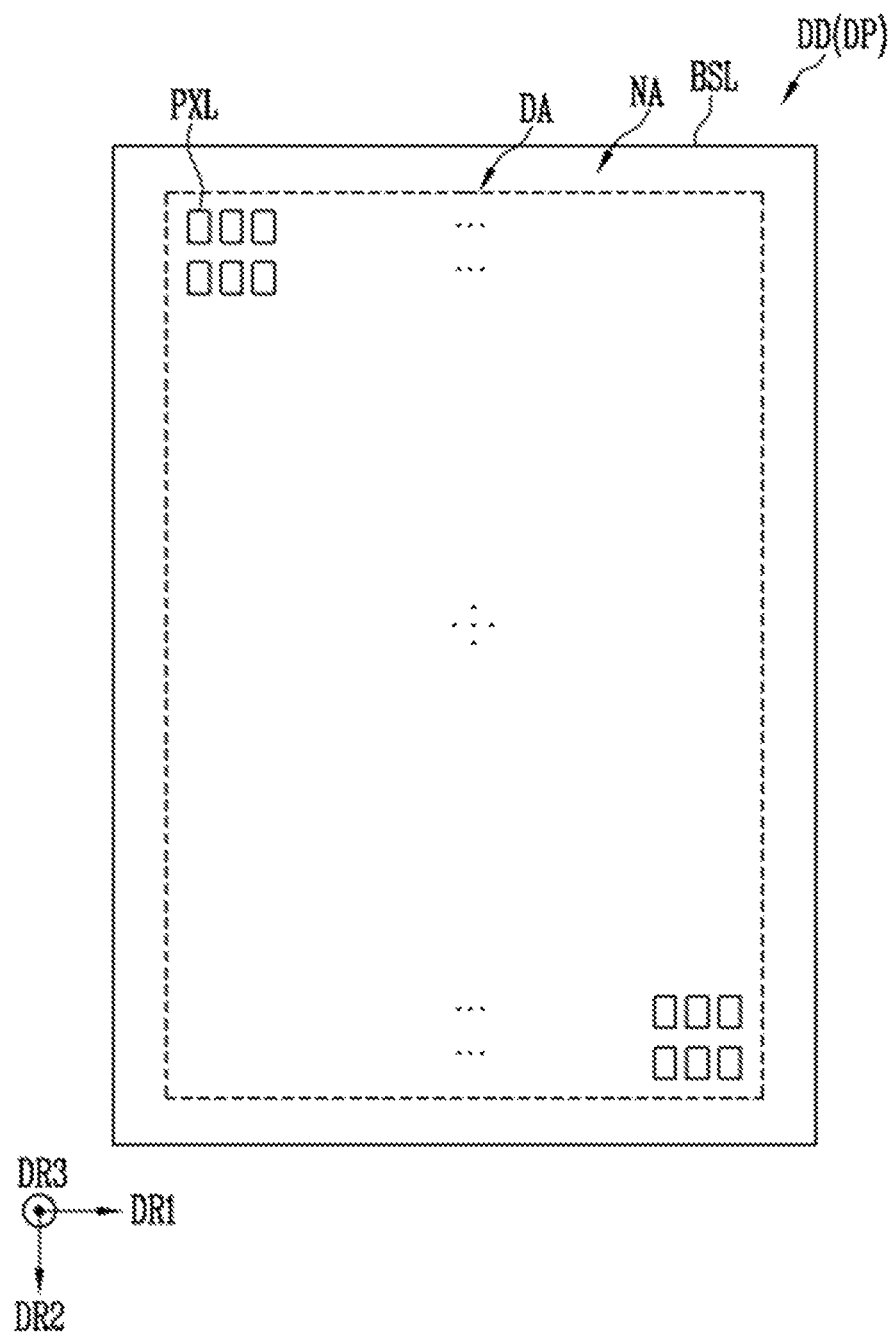
FIG. 3 illustrates a schematic plan view of a display device according to an embodiment.

FIG. 3 illustrates a schematic plan view of a display device DD according to an embodiment. For example, in FIG. 3, the display device DD will be disclosed as an example of a device that may use the light emitting element LD described in the embodiments of FIG. 1 and FIG. 2 as a light source, and particularly, a structure of the display device DD will be described based on a display panel DP. For example, each pixel PXL of the display panel DP may include at least one light emitting element LD.

FIG. 3 briefly illustrates a structure of the display panel DP based on a display area DA. However, in some embodiments, at least one driving circuit portion, wires, and/or pads, which are not shown, may be further provided in the display panel DP.

Referring to FIG. 3, the display panel DP may include a base layer BSL, and the pixels PXL provided on the base layer BSL.

The display panel DP and the base layer BSL for forming the display panel DP include a display area DA for displaying an image and a non-display area NA excluding the display area DA. The display area DA may comprise a screen on which an image is displayed, and the non-display area NA may be the remaining area except for the display area DA.

The display panel DP may be provided in a variety of shapes. For example, the display panel DP may be provided in a rectangular plate shape, but the embodiments are not limited thereto. For example, the display panel DD may have a shape such as a circle or an ellipse. The display panel DP may include an angled corner and/or curved line type corner.

For convenience, FIG. 3 illustrates display panel DP shaped as a rectangular plate including a pair of short sides and a pair of long sides, wherein an extension direction of the short side is referred to as a first directional axis DR1, an extension direction of the long side is referred to as a second directional axis DR2, and a direction (for example, in a thickness or height direction of the display device DD) perpendicular to the extension directions of the short side and the long side is referred to as a third directional axis DR3. However, this may be changed according to the shapes of the display panel DP.

The display area DA may have a variety of shapes. For example, the display area DA may have a rectangular shape, a circular shape, or an elliptical shape. In the embodiment, the display area DA may have a shape corresponding to the shape of the display panel DP, but the embodiments are not limited thereto.

The pixels PXL may be disposed in the display area DA on the base layer BSL. For example, the display area DA may include pixel areas in which pixels PXL are disposed.

The non-display area NA may be disposed around the display area DA. In the non-display area NA, wires electrically connected to the pixels PXL of the display area DA, pads, and/or internal circuit parts may be disposed.

In some embodiments, at least two types of pixels PXL emitting light of different colors may be disposed in the display area DA. The pixels PXL of different colors disposed adjacent to each other may comprise a pixel unit that may emit light of a variety of colors.

In an embodiment, each pixel PXL may be set to a pixel (or sub-pixel) emitting light of a specific color, and may include a light emitting element LD that generates light of the specific color. In another embodiment, at least some of the pixels PXL may include a light emitting element LD that generates light of a first color, and a light conversion layer may be disposed at an upper portion of the pixel PXL that may convert the light of the first color into light of a second color. Accordingly, the light of the second color may be generated by using the at least some of the pixels PXL.

The pixel PXL may include at least one light source driven by a control signal (for example, a scan signal and a data signal) and/or a power source (for example, a first power source and a second power source). In an embodiment, the light source may include at least one light emitting element LD according to the embodiments of FIG. 1 and FIG. 2, for example, at least one rod-like light emitting element LD having a nanoscale to microscale size. Different types of light emitting elements may be used as a light source of the pixel PXL. For example, in another embodiment, a light source for each pixel PXL may be comprised of a light emitting element having a core-shell structure.

The pixel PXL may have a structure according to at least one of embodiments to be described below. For example, each pixel PXL may have a structure applying one of embodiments to be described later, or a structure combining at least two embodiments.

The pixel PXL may be an active pixel, but the embodiments are not limited thereto. For example, the pixel PXL may be a passive pixel.

Figure 4:
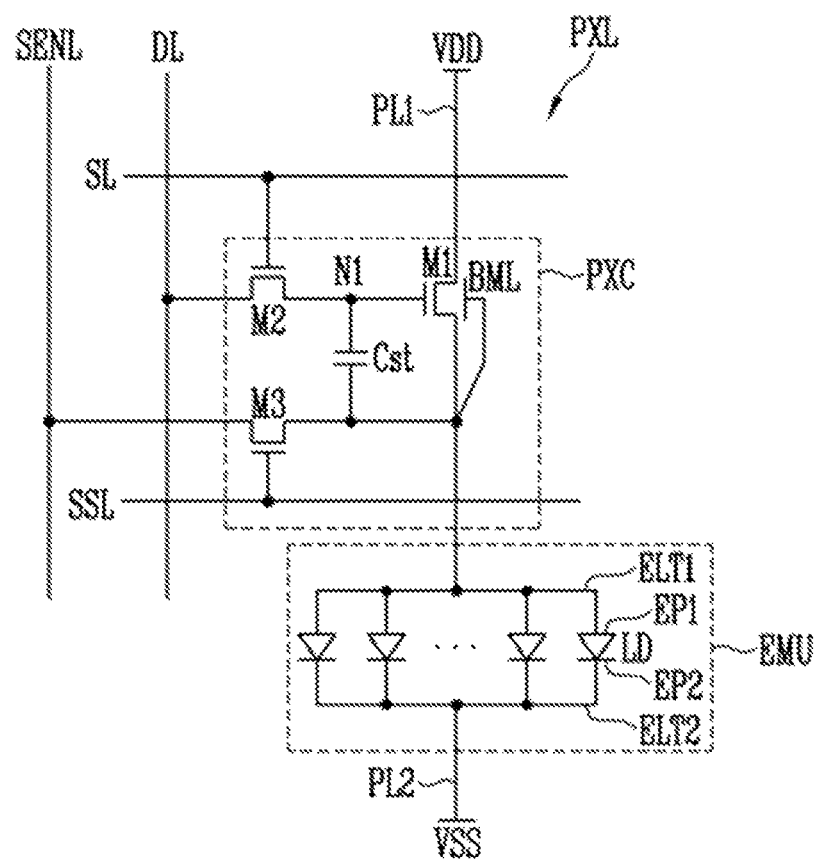
FIG. 4 and FIG. 5 illustrate schematic diagrams of equivalent circuits of a pixel according to an embodiment.
Figure 5:
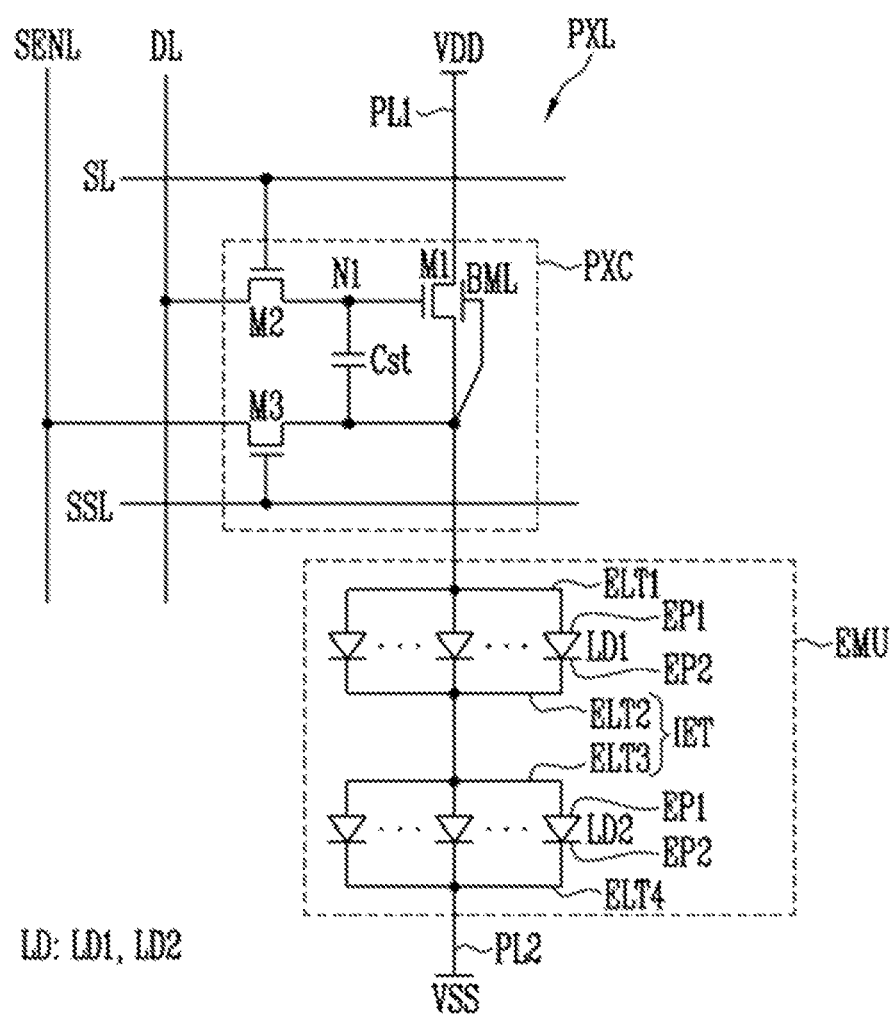

FIG. 4 and FIG. 5 illustrate schematic diagrams of equivalent circuits of the pixel PXL according to an embodiment. For example, FIG. 4 and FIG. 5 show the pixels PXL including light emitting units EMU having different structures.

In some embodiments, each pixel PXL illustrated in FIG. 4 and FIG. 5 may be one of the pixels PXL disposed in the display area DA of FIG. 3. In embodiment, the pixels PXL disposed in the display area DA may have substantially the same or similar structure.

Referring to FIG. 4 and FIG. 5, the pixel PXL includes the light emitting unit EMU for generating light with luminance corresponding to a data signal. The pixel PXL may include a pixel circuit PXC for driving the light emitting unit EMU.

The pixel circuit PXC may be electrically connected between a first power source VDD and the light emitting unit EMU. The pixel circuit PXC may be electrically connected to a scan line SL and a data line DL of the pixel PXL to control an operation of the light emitting unit EMU in response to a scan signal and a data signal supplied from the scan line SL and the data line DL. The pixel circuit PXC may be further electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 is electrically connected between the first power source VDD and a first electrode ELT1 of the light emitting unit EMU. A gate electrode of the first transistor M1 is electrically connected to a first node N1. The first transistor M1 controls a driving current supplied to the light emitting unit EMU in response to a voltage of the first node N1. The first transistor M1 may be a driving transistor that controls a driving current of the pixel PXL.

In an embodiment, the first transistor M1 may include a bottom metal layer BML (also referred to as a "lower electrode", "back gate electrode", or "lower light blocking layer"). The gate electrode of the first transistor M1 and the bottom metal layer BML may overlap each other with an insulating layer interposed therebetween. In an embodiment, the bottom metal layer BML may be electrically connected to one electrode of the first transistor M1, for example a source electrode (or drain electrode) thereof.

In the embodiment in which the first transistor M1 includes the bottom metal layer BML, by applying a back-biasing voltage to the bottom metal layer BML of the first transistor M1 when the pixel PXL is driven, a back-biasing technique (or a sync technique) of moving a threshold voltage of the first transistor M1 in a negative or positive direction may be applied. For example, a source-sync technique may be applied by electrically connecting the bottom metal layer BML to the source electrode of the first transistor M1. In case that the bottom metal layer BML is disposed under a semiconductor pattern forming a channel of the first transistor M1, the bottom metal layer BML may serve as a light blocking pattern to stabilize operating characteristics of the first transistor M1. However, the function and/or utilization method of the bottom metal layer BML in the embodiments is not limited thereto.

The second transistor M2 is electrically connected between the data line DL and the first node N1. A gate electrode of the second transistor M2 is electrically connected to the scan line SL. When a scan signal of a gate-on voltage (for example, a high level voltage) is supplied from the scan line SL, the second transistor M2 is turned on to electrically connect the data line DL and the first node N1.

For each frame period, a data signal of the corresponding frame is supplied to the data line DL, and the data signal is transmitted to the first node N1 through the turned-on second transistor M2 during a period in which the scan signal of the gate-on voltage is supplied. The second transistor M2 may be a switching transistor for transmitting each data signal to the inside of the pixel PXL.

One electrode of the storage capacitor Cst is electrically connected to the first node N1, and the other electrode thereof is electrically connected to a second electrode of the first transistor M1. The storage capacitor Cst is charged with a voltage corresponding to the data signal supplied to the first node N1 during each frame period.

The third transistor M3 is electrically connected between the second electrode of the first transistor M1 (and/or the first electrode ELT1 of the light emitting unit EMU) and the sensing line SENL. A gate electrode of the third transistor M3 is electrically connected to the sensing signal line SSL. The third transistor M3 may transmit a voltage applied to the second electrode of the first transistor M1 to the sensing line SENL according to a sensing signal supplied to the sensing signal line SSL. The voltage transmitted through the sensing line SENL may be provided to an external circuit (for example, a timing controller), and the external circuit may obtain characteristic information (for example, a threshold voltage of the first transistor M1) of each pixel PXL based on the supplied voltage. The obtained characteristic information may be used to convert image data so that a characteristic deviation of the pixels PXL is compensated.

In FIG. 4 and FIG. 5, all of the transistors included in the pixel circuit PXC are illustrated as N-type transistors, but the embodiments are not limited thereto. For example, at least one of the first, second, and third transistors M1, M2, and M3 may be changed to a P-type transistor.

The structure and driving method of the pixel PXL may be modified in the embodiments. For example, the pixel circuit PXC may be comprised as a pixel circuit having other structures and/or driving methods in addition to those of the embodiments shown in FIG. 4 and FIG. 5.

For example, the pixel circuit PXC may not include the third transistor M3. The pixel circuit PXC may further include other circuit elements such as a compensation transistor for compensating for a threshold voltage of the first transistor M1, an initialization transistor for initializing the voltage of the first node N1 and/or of the first pixel electrode ELT1 of the light emitting unit EMU, a light emission control transistor for controlling a period in which a driving current is supplied to the light emitting unit EMU, and/or a boosting capacitor for boosting the voltage of the first node N1.

In another embodiment, when the pixel PXL is a pixel of a passive light emitting display device, the pixel circuit PXC may be omitted. The light emitting unit EMU may be directly connected to the scan line SL, the data line DL, a first power line PL1, a second power line PL2, and/or other signal line or power line.

For example, light emitting unit EMU may include at least one light emitting element LD electrically connected between a first power source VDD and a second power source VSS. The first and second power sources VDD and VSS may have different potentials so that the light emitting elements LD may emit light. For example, the first power source VDD may be set as a high potential power source, and the second power source VSS may be set as a low potential power source.

In an embodiment, the light emitting unit EMU may include light emitting elements LD electrically connected in parallel to each other as shown in FIG. 4.

Referring to FIG. 4, the light emitting unit EMU may include the first electrode ELT1, a second electrode ELT2, and a plurality of light emitting elements LD electrically connected in parallel between the first electrode ELT1 and the second electrode ELT2. The first electrode ELT1 may be electrically connected to the first power source VDD through the pixel circuit PXC and/or the first power line PL1, and the second electrode ELT2 may be electrically connected to the second power source VSS through the second power line PL2. Each light emitting element LD may include the first end portion EP1 (for example, a P-type end portion) electrically connected to the first power source VDD through the first electrode ELT1 and/or the pixel circuit PXC, and the second end portion EP2 (for example, an N-type end portion) electrically connected to the second power source VSS through the second electrode ELT2. The light emitting elements LD may be electrically connected in parallel in a forward direction between the first and second electrodes ELT1 and ELT2.

In another embodiment, the light emitting unit EMU may include light emitting elements LD electrically connected in series or in serial/parallel. For example, the light emitting unit EMU may include light emitting elements LD that are divided into two serial stages and electrically connected to each other, as shown in FIG. 5.

Referring to FIG. 5, the light emitting unit EMU may include a first serial stage including at least one first light emitting element LD1 and a second serial stage including at least one second light emitting element LD2.

The first serial stage may include the first electrode ELT1, the second electrode ELT2, and at least one first light emitting element LD1 electrically connected between the first and second electrodes ELT1 and ELT2. For example, the first serial stage may include the first light emitting elements LD1 electrically connected in parallel to each other between first and second electrodes ELT1 and ELT2.

The first electrode ELT1 may be electrically connected to the first power source VDD through the pixel circuit PXC and/or the first power line PL1, and the second electrode ELT2 may be electrically connected to the second power source VSS through the second serial stage and/or the second power line PL2. Each first light emitting element LD1 may be electrically connected in a forward direction between the first and second electrodes ELT1 and ELT2. For example, the first end portion EP1 of the first light emitting element LD1 may be electrically connected to the first electrode ELT1, and the second end portion EP2 of the first light emitting element LD1 may be electrically connected to the second electrode ELT2.

The second serial stage may include the third electrode ELT3, the fourth electrode ELT4, and at least one second light emitting element LD2 electrically connected between the third and fourth pixel electrodes ELT3 and ELT4. For example, the second serial stage may include the second light emitting elements LD2 electrically connected in parallel to each other between third and fourth electrodes ELT3 and ELT4.

The third electrode ELT3 may be integrally or non-integrally connected to the second electrode ELT2, and the second and third electrodes ELT2 and ELT3 may form an intermediate electrode IET connecting the first and second serial stages. The fourth electrode ELT4 may be electrically connected to the second power source VSS via the second power line PL2. Each second light emitting element LD2 may be electrically connected in a forward direction between the third and fourth electrodes ELT3 and ELT4. For example, the first end portion EP1 of the second light emitting element LD2 may be electrically connected to the third electrode ELT3, and the second end portion EP2 of the second light emitting element LD2 may be electrically connected to fourth electrode ELT4.

The number of serial stages comprising each light emitting unit EMU may be modified according to embodiments. For example, the light emitting unit EMU may include light emitting elements LD that are divided into three or more serial stages and electrically connected to each other.

In the embodiments, the light emitting unit EMU may include at least one serial stage. Each serial stage may include a pair of pixel electrodes, and at least one light emitting element LD electrically connected in a forward direction between the pair of electrodes. Here, the number of serial stages forming the light emitting unit EMU and the number of light emitting elements LD forming each serial stage are not particularly limited. For example, the numbers of light emitting elements LD included in respective serial stage may be the same or different from each other.

A first electrode of the light emitting unit EMU, for example, the first electrode ELT1 may be an anode electrode of the light emitting unit EMU. A last electrode of the light emitting unit EMU, for example, the second electrode ELT2 or fourth electrode ELT4 may be a cathode electrode of the light emitting unit EMU.

In case that the light emitting elements LD are electrically connected only in parallel as in the embodiment of FIG. 4, the structure of the pixel PXL may be simplified. As in the embodiments of FIG. 5, in case that the light emitting elements LD are electrically connected in series/parallel (or series), power efficiency may be improved compared to the embodiment in which the same number of light emitting elements LD are electrically connected only in parallel (for example, the embodiment of FIG. 4). In the pixel PXL in which the light emitting elements LD are electrically connected in series or in series/parallel, even if a short circuit defect occurs at some of the serial stages, since a degree of luminance may be displayed through the light emitting elements LD in the remaining serial stages, the possibility of dark spot defects of the pixel PXL may be reduced.

FIG. 4 and FIG. 5 illustrate the embodiments in which the light emitting elements LD are electrically connected in parallel or series/parallel, but the embodiments are not limited thereto. For example, in another embodiment, the light emitting unit EMU may be comprised of light emitting elements LD electrically connected only in series.

Each light emitting element LD electrically connected to in a forward direction between the first power source VDD and the second power source VSS may comprise each effective light source. These effective light sources may be collected to form the light emitting unit EMU (or light source part) of the pixel PXL.

In case that a driving current is supplied through the corresponding pixel circuit PXC, the light emitting elements LD may emit light with luminance corresponding to the driving current. For example, during each frame period, the pixel circuit PXC may supply a driving current corresponding to a gray value to be displayed in the corresponding frame to the light emitting unit EMU. Accordingly, while the light emitting elements LD emit light with luminance corresponding to the driving current, the light emitting unit EMU may display the luminance corresponding to the driving current.

In an embodiment, the light emitting unit EMU may further include at least one ineffective light source in addition to the light emitting elements LD comprising each effective light source. For example, in at least one serial stage, at least one ineffective light emitting element that is arranged in a reverse direction or of which at least one end portion floats may be further electrically connected. The ineffective light emitting element maintains a deactivated state even when a driving voltage of a forward direction is applied between a pair of electrodes, thereby substantially maintaining a non-light emitting state.

Figure 6A:
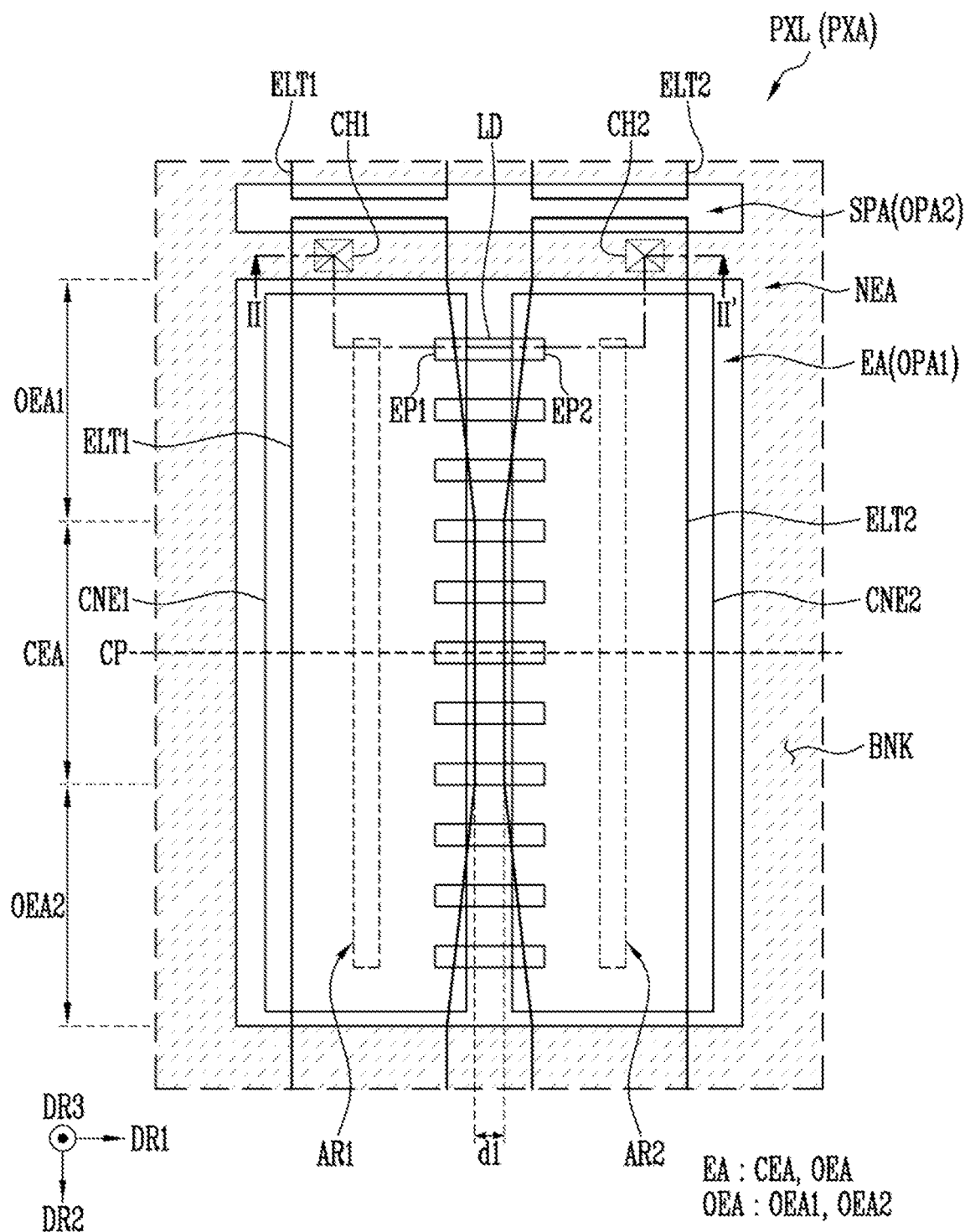
FIG. 6A to FIG. 6C illustrate schematic plan views of a pixel according to an embodiment.
Figure 6B:
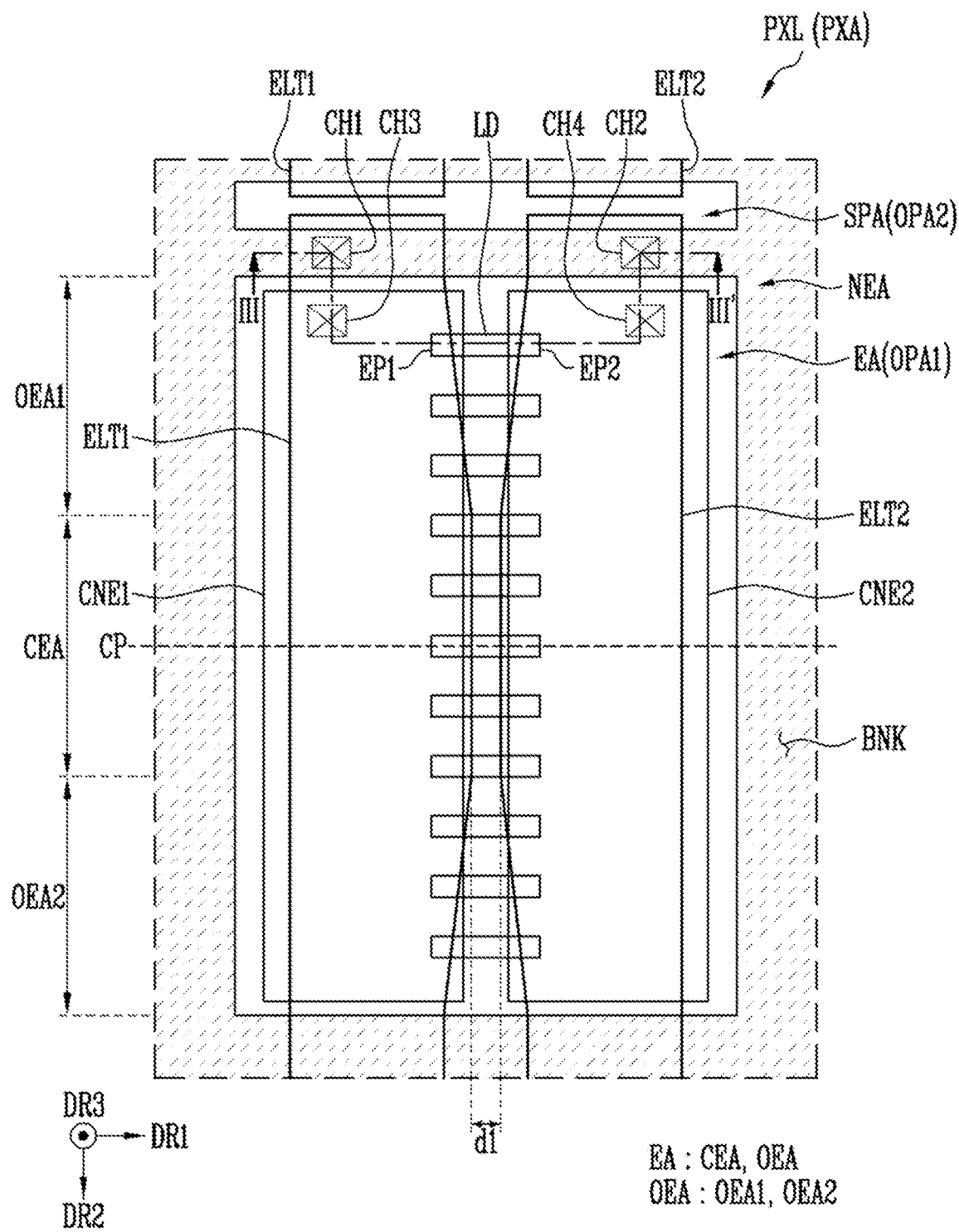
Figure 6C:
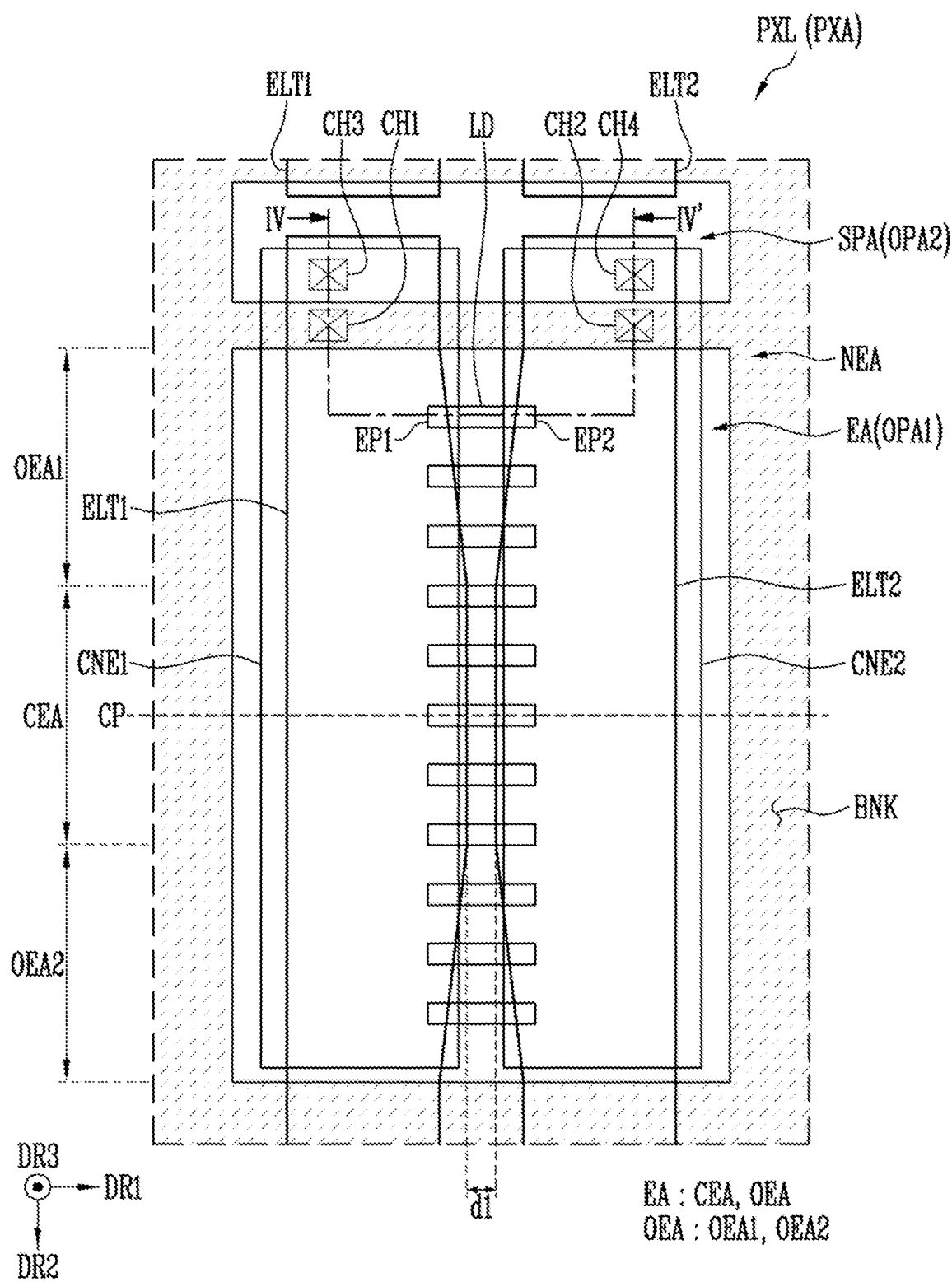

FIG. 6A to FIG. 6C illustrate a schematic plan views of the pixel PXL according to an embodiment. For example, FIG. 6A to FIG. 6C illustrate different embodiments related to connection structures between the first and second electrodes ELT1 and ELT2 and between first and second contact electrodes CNE1 and CNE2.

In FIG. 6A to FIG. 6C, a structure of the pixel PXL is illustrated based on the light emitting unit EMU of each pixel PXL. For example, FIG. 6A to FIG. 6C illustrate a structure example of the light emitting unit EMU that includes the first electrode ELT1 and the second electrode ELT2, and the light emitting elements LD electrically connected in parallel between the first and second electrodes ELT1 and ELT2, as in the embodiment of FIG. 4.

FIG. 6A to FIG. 6C illustrate an embodiment in which each light emitting unit EMU is electrically connected to a predetermined power line (for example, the first and/or second power lines PL1 and PL2), a circuit element (for example, at least one circuit element comprising the pixel circuit PXC), and/or a signal line (for example, the scan line Si and/or the data line Dj), through first and second contact holes CH1 and CH2. However, the embodiments are not limited thereto. For example, at least one of the first and second electrodes ELT1 and ELT2 of each pixel PXL may be directly connected to a power line and/or signal line without passing through a contact hole and/or a middle line.

Referring to FIG. 6A to FIG. 6C, the pixel PXL is provided in each pixel area PXA. The pixel area PXA may mean a pixel circuit area in which circuit elements for comprising the corresponding pixel PXL are disposed, and a light emitting area EA in which the light emitting unit EMU of the pixel PXL is disposed.

The pixel area PXA includes the light emitting area EA and a non-light emitting area NEA surrounding the light emitting area EA, and may further include a separating area SPA spaced apart from the emitting area EA with the non-light emitting area NEA interposed therebetween. A bank BNK may be provided in the non-light emitting area NEA, and the bank BNK may not be provided in the light emitting area EA and/or the separating area SPA.

The light emitting area EA may be an area in which at least one light emitting element LD comprising the light emitting unit EMU of each pixel PXL is supplied and aligned. Hereinafter, it is assumed that light emitting elements LD are provided in each light emitting area EA, and each embodiment will be described.

One area of electrodes electrically connected to the light emitting elements LD (for example, the first and second electrodes ELT1 and ELT2 and/or the first and second contact electrodes CNE1 and CNE2) or of the above-mentioned electrodes may be disposed in the light emitting area EA. In an embodiment, the light emitting area EA may be surrounded by the bank BNK.

The pixel PXL may include the first electrode ELT1 and the second electrode ELT2 disposed to be spaced apart from each other in the light emitting area EA, and the light emitting elements LD disposed and/or aligned between the first electrode ELT1 and the second electrode ELT2. Here, that the light emitting elements LD are dispose and/or aligned between the first and second electrodes ELT1 and ELT2 may mean that at least one area of each of the light emitting elements LD is disposed in an area between the first and second electrodes ELT1 and ELT2, when viewed in a plan view.

The pixel PXL may further include the first contact electrodes CNE1 and the second contact electrodes CNE2 electrically connected to the first end portions EP1 and the second end portion s EP2 of the light emitting elements LD. The pixel PXL may further include at least one other electrode, a conductive pattern, and/or an insulating pattern. As an example, the pixel PXL may include at least one pattern (for example, first and second patterns BNP1 and BNP2 of FIG. 7A to FIG. 8B) disposed under the first and second electrodes ELT1 and ELT2 so as to overlap one area of each of the first and second electrodes ELT1 and ELT2.

The first electrode ELT1 and the second electrode ELT2 may be spaced apart from each other along the first directional axis DR1 in each light emitting area EA, and may respectively extend along the second directional axis DR2. The first directional axis DR1 and the second directional axis DR2 may be directions that cross each other (for example, are perpendicular to each other). In an embodiment, the first directional axis DR1 may be a horizontal direction (or row direction) of the display area DA, and the second directional axis DR2 may be a vertical direction (or column direction) of the display area DA, but they are not limited thereto.

The first and second electrodes ELT1 and ELT2 may have different shapes and/or sizes. FIG. 6A to FIG. 6C illustrate an embodiment in which one first electrode ELT1 and one second electrode ELT2 are disposed in each light emitting area EA, but the number of the first and second electrodes ELT1 and ELT2 disposed in each pixel PXL may be changed.

In case that first electrodes ELT1 are disposed in one pixel PXL, the first electrodes ELT1 may be integrally or non-integrally electrically connected to each other. Similarly, when second electrodes ELT2 are disposed in one pixel PXL, the second electrodes ELT2 may be integrally or non-integrally electrically connected to each other.

In an embodiment, the first and second electrodes ELT1 and ELT2 may have symmetrical shapes in the light emitting element alignment area where the light emitting elements LD are aligned between the first and second electrodes ELT1 and ELT2. For example, the first and second electrodes ELT1 and ELT2 may have shapes that are left/right-symmetrical to each other (horizontally symmetrical) in the at least light emitting area EA with the light emitting elements LD interposed between them.

In an embodiment, the first and second electrodes ELT1 and ELT2 may have shapes to be symmetrical about a central portion CEA of the light emitting area EA. For example, the light emitting area EA may include the central portion CEA and outer portions OEA in the second directional axis DR2, and the first and second electrodes ELT1 and ELT2 may have shapes that are up/down-symmetrical (vertically symmetrical) around the central portion CEA. The outer portions OEA may include first and second outer portions OEA1 and OEA2 disposed at respective sides of the central portion CEA in the second directional axis DR2. For example, the outer portions OEA may include the first outer portion OEA1 disposed at an upper end of the central portion CEA and the second outer portion OEA2 disposed at a lower end of the central portion CEA.

The first electrode ELT1 and/or the second electrode ELT2 may have a pattern separated for each pixel PXL, or a pattern that is commonly connected to pixels PXL. For example, the first and second electrodes ELT1 and ELT2 may be disconnected in the separating area SPA disposed outside the corresponding light emitting area EA. In another embodiment, at least one of the first and second electrodes ELT1 and ELT2 may have an independent pattern cut off inside the light emitting area EA. For example, the first electrode ELT1 may be cut off inside the light emitting area EA, or both the first and second electrodes ELT1 and ELT2 may be cut off inside the light emitting area EA. In another example, the first electrode ELT1 may be cut off in the separating area SPA, or both of the first and second electrodes ELT1 and ELT2 may be cut off in the separating area SPA. In another embodiment, the first electrode ELT1 may have an independent pattern cut off inside the light emitting area EMA or the light emitting area EMA, and one end of the second electrode ELT2 may extend in the first directional axis DR1 or second directional axis DR2 to be integrally connected to the second electrode ELT2 of another pixel PXL adjacent in the first directional axis DR1 or second directional axis DR2. At least one of the first and second electrodes ELT1 and ELT2 may have a pattern separated for each pixel PXL.

Before the process of forming the pixel PXL, and before the alignment of the light emitting elements LD is completed, the first electrodes ELT1 of the pixels PXL disposed in the display area DA are connected to each other, and the second electrodes ELT2 of the pixels PXL may be connected to each other. For example, before the alignment of the light emitting elements LD is completed, the first electrodes ELT1 of the pixels PXL may be integrally or non-integrally electrically connected to each other to form a first alignment wire, and the second electrodes ELT2 of the pixels PXL may be integrally or non-integrally electrically connected to each other to form a second alignment wire.

The first alignment wire and the second alignment wire may receive a first alignment signal (or, first alignment voltage) and a second alignment signal (or second alignment voltage), respectively, in the alignment step of the light emitting elements LD. For example, the first or the second alignment wires may be supplied with an AC-type alignment signal, and the other may be supplied with an alignment voltage (for example, ground voltage) having a constant voltage level.

In the alignment step of light emitting elements LD, the first and second alignment wires may be supplied with different alignment signals. Accordingly, an electric field is formed between the first and second alignment wires, so that the light emitting elements LD supplied to each light emitting area EA may be aligned between the first and second alignment wires. After the alignment of the light emitting elements LD is completed, at least first alignment wire is cut off in the separating area SPA to be separated into the first electrodes ELT1, so that it is possible to form the pixels PXL that may be individually driven.

The first electrode ELT1 may be electrically connected to a circuit element (for example, at least one transistor comprising the pixel circuit PXC), a power line (for example, the first power line PL1), and/or a signal line (for example, the scan line SL, the data line DL, or a control line), through the first contact hole CH1. In another embodiment, the first electrode ELT1 may be directly connected to a power line or signal line.

In an embodiment, the first electrode ELT1 may be electrically connected to a circuit element disposed thereunder through the first contact hole CH1, and to a first wire through the circuit element. The first wire may be the first power line PL1 for supplying the first power source VDD, but is not limited thereto.

The second electrode ELT2 may be electrically connected to a circuit element (for example, at least one transistor comprising the pixel circuit PXC), a power line (for example, the second power line PL2), and/or a signal line (for example, the scan line SL, the data line DL, or a control line), through the second contact hole CH2. In another embodiment, the second electrode ELT2 may be directly connected to a power line or signal line.

In an embodiment, the second electrode ELT2 may be electrically connected to the second wire disposed thereunder through the second contact hole CH2. The second wire may be the second power line PL2 for supplying the second power source VSS, but the embodiments are not limited thereto.

Each of the first and second contact holes CH1 and CH2 may or may not overlap the bank BNK. For example, as shown in FIG. 6A to FIG. 6C, the first and second contact holes CH1 and CH2 may be disposed in the non-light emitting area NEA between the light emitting area EA and the separating area SPA, and may overlap the bank BNK. In another embodiment, at least one of the first and second contact holes CH1 and CH2 may be disposed in the light emitting area EA or the separating area SPA.

Each of the first and second electrodes ELT1 and ELT2 may be comprised of a single layer or multilayer. For example, the first electrode ELT1 includes at least one reflective electrode layer including a reflective conductive material, and may further include at least one transparent electrode layer and/or a conductive capping layer. Similarly, the second electrode ELT2 includes at least one reflective electrode layer including a reflective conductive material, and may further include at least one transparent electrode layer and/or a conductive capping layer. The reflective conductive material may include at least one metal having a high reflectance in the visible light wavelength band, for example, aluminum (Al), gold (Au), and silver (Ag), but the embodiments are not limited thereto.

The light emitting elements LD may be disposed and/or aligned between the first electrode ELT1 and the second electrode ELT2. For example, the light emitting elements LD may be arranged in parallel between the first electrode ELT1 and the second electrode ELT2. For example, each light emitting element LD may be aligned between the first electrode ELT1 and the second electrode ELT2 in the first directional axis DR1, and thus may be electrically connected between the first and second electrodes ELT1 and ELT2.

FIG. 6A to FIG. 6C illustrate that all of the light emitting elements LD are uniformly aligned in the first directional axis DR1, but the embodiments are not limited thereto. For example, at least one of the light emitting elements LD may be arranged in a diagonal direction inclined with respect to the first and second directional axes DR1 and DR2 between the first and second electrodes ELT1 and ELT2.

In some embodiments, each light emitting element LD may be an ultra-small light emitting element using a material having an inorganic crystal structure, for example, having a size as small as nano-scale or micro-scale, but the embodiments are not limited thereto. Each light emitting element LD may be a rod-like light emitting element as shown in FIG. 1 and FIG. 2, but the embodiments are not limited thereto.

Each light emitting element LD may include a first end portion EP1 and a second end portion EP2. The first end portion EP1 may be disposed to be adjacent to the first electrode ELT1, and the second end portion EP2 may be disposed to be adjacent to the second electrode ELT2. For example, the first end portion EP1 may be disposed toward the first electrode ELT2, and the second end portion EP2 may be disposed toward the second electrode ELT2. The first end portion EP1 may or may not overlap the first electrode ELT1. The second end portion EP2 may or may not overlap the second electrode ELT2.

Each light emitting element LD may be electrically connected between the first electrode ELT1 and the second electrode ELT2.

In an embodiment, the first end portion EP1 of each of the light emitting elements LD may be electrically connected to the first electrode ELT1 through the first contact electrode CNE1, and the second end portion EP2 of each of the light emitting elements LD may be electrically connected to the second electrode ELT2 through the second contact electrode CNE2.

For example, as illustrated in FIG. 6A, the first contact electrode CNE1 may contact and be electrically connected to the first electrode ELT1 in a peripheral area (for example, an area AR1 adjacent to the first end portions EP1 of the light emitting elements LD) of an area in which the light emitting elements LD are arranged. In another example, as shown in FIG. 6B and FIG. 6C, the first contact electrode CNE1 may be electrically connected to the first electrode ELT1 through at least one third contact hole CH3 disposed in the light emitting area EA and/or the separating area SPA. As shown in FIG. 6C, when the third contact hole CH3 is disposed in the separating area SPA, the first contact electrode CNE1 may extend from the light emitting area EA through the non-light emitting area NEA to the separating area SPA.

As illustrated in FIG. 6A, the second contact electrode CNE2 may contact and be electrically connected to the second electrode ELT2 in a peripheral area (for example, an area AR2 adjacent to the second end portions EP2 of the light emitting elements LD) of an area in which the light emitting elements LD are arranged. In another example, as shown in FIG. 6B and FIG. 6C, the second contact electrode CNE2 may be electrically connected to the second electrode ELT2 through at least one fourth contact hole CH4 disposed in the light emitting area EA and/or the separating area SPA. As shown in FIG. 6C, when the fourth contact hole CH4 is disposed in the separating area SPA, the second contact electrode CNE2 may extend from the light emitting area EA through the non-light emitting area NEA to the separating area SPA.

In another embodiment, the first end portion EP1 of each of the light emitting elements LD may be directly connected to the first electrode ELT1, and the second end portion EP2 of each of the light emitting elements LD may be directly connected to the second electrode ELT2. In another embodiment, the first and/or second end portions EP1 and EP2 of the light emitting elements LD may be directly connected to only the first and/or second contact electrodes CNE1 and CNE2, but may not be directly connected to the first and/or second electrodes ELT1 and ELT2. In case that the light emitting elements LD directly connect to only the first and/or second contact electrodes CNE1 and CNE2, the first and/or second contact electrodes CNE1 and CNE2 may comprise the pixel electrodes instead of the first and/or second electrodes ELT1 and ELT2.

The light emitting elements LD may be prepared in a form dispersed in a solution to be supplied to the light emitting area EA of each pixel PXL through an inkjet method, a slit coating method, or other method. For example, the light emitting elements LD may be mixed with a volatile solvent, and then may be supplied to each light emitting area EA. In case that an electric field is formed by applying alignment signals to the first and second electrodes ELT1 and ELT2 (or first and second alignment wires) of the pixels PXL, the light emitting elements LD are aligned between the first and second electrodes ELT1 and ELT2. After the light emitting elements LD are aligned, the solvent may be removed by performing a drying process or the like.

In an embodiment, the light emitting elements LD may be bias-aligned so that the light emitting elements LD may be aligned in a more specific direction. For example, in the alignment step of the light emitting elements LD, the alignment direction of the light emitting elements LD may be controlled by adjusting the alignment signals or by forming a magnetic field so that the larger number and/or ratio of the light emitting elements LD supplied to each light emitting area EA may be electrically connected in a forward direction between the first and second electrodes ELT1 and ELT2. For example, the light emitting elements LD may be biased and aligned so that the first end portions EP1 of the light emitting elements LD are further directed toward the first electrode ELT1 (or the first alignment wire before being separated to the first electrode ELT1) and the second end portions EP2 of the light emitting elements LD are further directed toward the second electrode ELT2 (or the second alignment wire before being separated to the second electrode ELT2). A drying process for removing the solvent may be performed after the light emitting elements LD are aligned. In case that the light emitting elements LD are aligned in a desired direction as described above, a utilization rate of the light emitting elements LD supplied to each light emitting area EA may be increased. Accordingly, it is possible to reduce a manufacturing cost of the pixel PXL and to improve luminance.

In case that the light emitting elements LD are aligned by applying alignment signals including an alternating current (AC) signal to the first and second electrodes ELT1 and ELT2 (or first and second alignment wires), the light emitting elements LD may be concentrated on the outer portions OEA (OEA1 and OEA2) of the light emitting area EA or deviated from an aligned position due to the solvent flow due to the AC electro-osmosis (ACEO) effect. Accordingly, the alignment characteristic and utilization of the light emitting elements LD may be deteriorated, and the light emitting characteristic and the light efficiency of the pixel PXL may be deteriorated.

In the embodiment, by increasing the distance between the first and second electrodes ELT1 and ELT2 in the outer portions OEA (OEA1 and OEA2) of the light emitting area EA, compared with the central portion CEA, it is possible to weaken the intensity of the electric field formed in the outer portions OEA (OEA1 and OEA2) compared with that in the central portion CEA in the alignment step of the light emitting elements LD. Accordingly, it is possible to reduce or minimize flowing of the solvent due to the ACEO effect, and to prevent or minimize the light emitting elements LD from deviating from their aligned positions. According to the embodiment described above, a ratio of light emitting elements LD aligned in the central portion CEA of the light emitting area EA is increased, so that the alignment characteristics and utilization of the light emitting elements LD may be improved, and the light emitting characteristic and light efficiency of the pixel PXL may be improved.

In the pixel PXL according to the embodiment, the light emitting area EA may include the central portion CEA and the first and second outer portions OEA1 and OEA2 disposed at both sides of the central portion CEA, based on the second directional axis DR2. In some embodiments, the central portion CEA may include an area extending from a central point CP of the light emitting area EA in the second directional axis DR2 a predetermined length (or distance) to both sides. For example, the central portion CEA may include an area extending a predetermined distance towards the first and second outer portions OEA1 and OEA2 from the central point CP in the second directional axis DR2.

The first electrode ELT1 and the second electrode ELT2 may be spaced apart from each other by different intervals (or distances) in the central portion CEA compared to the outer portions OEA (OEA1 and OEA2) of the light emitting area EA. For example, the first electrode ELT1 and the second electrode ELT2 may be spaced apart from each other by a first distance d1 in the central portion CEA of the light emitting area EA, and may be spaced apart from each other by a distance larger than the first distance d1 in the outer portions OEA (OEA1 and OEA2) of the light emitting area EA. In the outer portions OEA (OEA1 and OEA2) of the light emitting area EA, the first electrode ELT1 and the second electrode ELT2 may be spaced apart from each other by an interval (or distance) that gradually increases farther away from the central portion CEA. In the outer portions OEA of the light emitting area EA, the interval (or distance) between the first electrode ELT1 and the second electrode ELT2 may change continuously or may change discontinuously (for example change in steps).

For example, the first electrode ELT1 and the second electrode ELT2 may be spaced apart from each other by the first interval (or distance) d1 along the first directional axis DR1 in the central portion CEA of the light emitting area EA. The first electrode ELT1 and the second electrode ELT2 may be spaced apart from each other by an interval larger than the first interval d1 along the first directional axis DR1 in the outer portions OEA (OEA1 and OEA2) of the light emitting area EA.

In an embodiment, the first interval (or distance) d1 may be maintained at a constant value. For example, the first electrode ELT1 and the second electrode ELT2 may be spaced apart from each other by a uniform first distance d1 in the central portion CEA of the light emitting area EA.

The distance the first electrode ELT1 and the second electrode ELT2 may be spaced apart from each other with respect to the first directional axis DR1 may gradually increase as the first and second electrodes ELT1 and ELT2 are farther away from the central portion CEA (and the center point CP) in the outer portions OEA (OEA1 and OEA2) of the light emitting area EA. For example, the first electrode ELT1 and the second electrode ELT2 may be spaced apart from each other at a linearly and/or continuously increasing interval (or distance) in the outer portions OEA (OEA1 and OEA2) of the light emitting area EA. For example, in the first electrode ELT1 and the second electrode ELT2, respective surfaces facing each other in the outer portions OEA of the light emitting area EA may have diagonal shapes, and the first electrode ELT1 and the second electrode ELT2 may be spaced apart from each other at a gradually increasing interval (or distance) as they are farther away from the central portion CEA.

The first contact electrode CNE1 and the second contact electrode CNE2 may be provided on the first end portions EP1 and the second end portions EP2 of the light emitting elements LD, respectively. Accordingly, the light emitting elements LD may be stably connected between the first and second electrodes ELT1 and ELT2.

The first contact electrode CNE1 may be disposed on the first end portions EP1 of the light emitting elements LD and the first electrode ELT1, and may electrically connect the first end portions EP1 of the light emitting elements LD to the first electrode ELT1. The first contact electrode CNE1 may stably fix the first end portions EP1 of the light emitting elements LD.

The second contact electrode CNE2 may be disposed on the second end portions EP2 of the light emitting elements LD and the second electrode ELT2, and may electrically connect the second end portions EP2 of the light emitting elements LD to the second electrode ELT2. The second contact electrode CNE2 may stably fix the second end portions EP2 of the light emitting elements LD.

In another embodiment, at least one of the first and second contact electrodes CNE1 and CNE2 may not be provided. In this case, the light emitting elements LD may be directly connected to the first and/or second electrodes ELT1 and ELT2.

The bank BNK may be disposed around the light emitting area EA surrounding the light emitting area EA of each pixel PXL. For example, the bank BNK may be disposed in an outer area of each pixel area PXA and/or an area between adjacent pixel areas PXA so as to surround each light emitting area EA. For example, the bank BNK may include a first opening OPA1 corresponding to the light emitting area EA of each pixel PXL, and may have a mesh shape in the entire display area DA.

In an embodiment, the bank BNK may further include a second opening OPA2 corresponding to the separating area SPA between neighboring pixels PXL on the first directional axis DR1 and/or the second directional axis DR2. Accordingly, the alignment wires may be easily cut off in the separating area SPA to separate the alignment wires into the first and second electrodes ELT1 and ELT2 of each pixel PXL.

The bank BNK may or may not partially overlap the first and/or second electrodes ELT1 and/or ELT2. For example, the first and second electrodes ELT1 and ELT2 may extend to the non-light emitting area NEA and overlap the bank BNK, or may be cut off within the light emitting area EA and not overlap the bank BNK.

The bank BNK may or may not overlap the first and/or second contact holes CH1 and CH2. For example, the first and second contact holes CH1 and CH2 may be formed in the non-light emitting area NEA and overlap the bank BNK, or may be formed in the light emitting area EA or the separating area SPA and not overlap the bank BNK.

The bank BNK may include at least one light-blocking and/or reflective material to prevent light leakage between adjacent pixels PXL. For example, the bank BNK may include at least one of a black matrix material and/or a color filter material of a specific color. For example, the bank BNK may be formed in a black opaque pattern to block light transmission.

The bank BNK may function as a dam structure that defines each light emitting area EA in which the light emitting elements LD may be supplied to each pixel PXL. For example, each light emitting area EA is partitioned by the bank BNK, so that a desired type and/or amount of light emitting element ink (for example, a solution containing at least one kind of light emitting elements LD) may be supplied to each light emitting area EA.

According to an embodiment, by increasing the interval (or distance) between the first electrode ELT1 and the second electrode ELT2 in the outer portions OEA (OEA1 and OEA2) of the light emitting area EA, it is possible to prevent the light emitting elements LD from concentrating in the outer portions OEA (OEA1 and OEA2) of the light emitting area EA due to the ACEO effect, and it is possible to more stably align the light emitting elements LD between the first electrode ELT1 and the second electrode ELT2. For example, by differentially adjusting the interval (or distance) between the first electrode ELT1 and the second electrode ELT2 in the light emitting area EA, in the alignment step of the light emitting elements LD, it is possible to form a weak electric field in the outer portions OEA (OEA1 and OEA2) compared with in the central portion CEA of the light-emitting area EA. Accordingly, it is possible to prevent the flow and aggregation of the light emitting elements LD due to the AC electro-osmosis (ACEO) effect, and to improve the utilization rate and alignment characteristics of the light emitting elements LD.

FIG. 6A to FIG. 6C illustrate the embodiment in which the light emitting elements LD are arranged between the first electrode ELT1 and the second electrode ELT2 in the entire light emitting area EA including the central portion CEA and the outer portions OEA (OEA1 and OEA2) based on the second directional axis DR2, but the embodiments are not limited thereto. For example, in another embodiment, a partial area and/or section of the light emitting area EA may be defined as a light emitting element arrangement area, and the interval (or distance) between first electrode ELT1 and the second electrode ELT2 may be suitable for aligning the light emitting elements within the light emitting element arrangement area. For example, the distance between the first electrode ELT1 and second electrode ELT2 may be small enough to align the light emitting elements in the light emitting element arrangement area but not in other areas. By dividing the light emitting element arrangement area into a central portion and an outer portion and adjusting the interval (or distance) between the first electrode ELT1 and the second electrode ELT2, the alignment and/or distribution characteristics of the light emitting elements LD within the light emitting element arrangement area may be controlled.

Figure 7A:
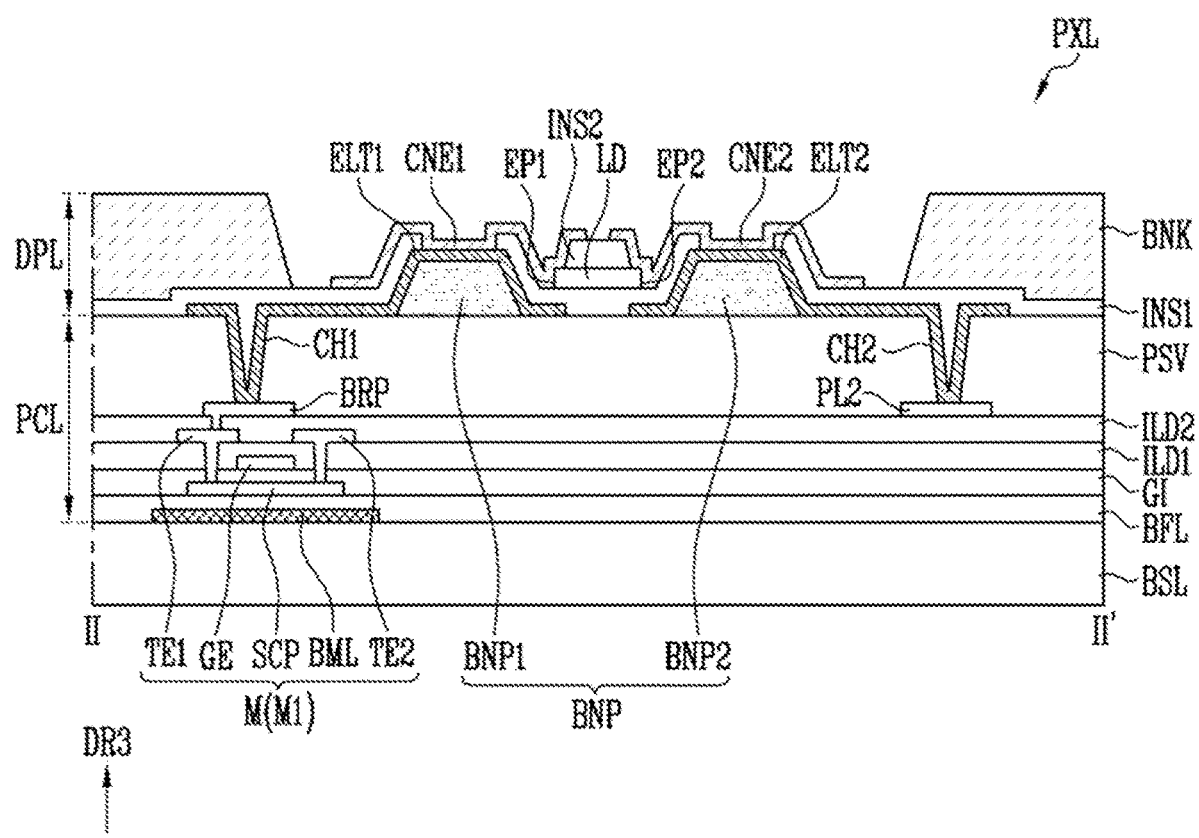
FIG. 7A and FIG. 7B respectively illustrate schematic cross-sectional views of a pixel according to an embodiment.
Figure 7B:
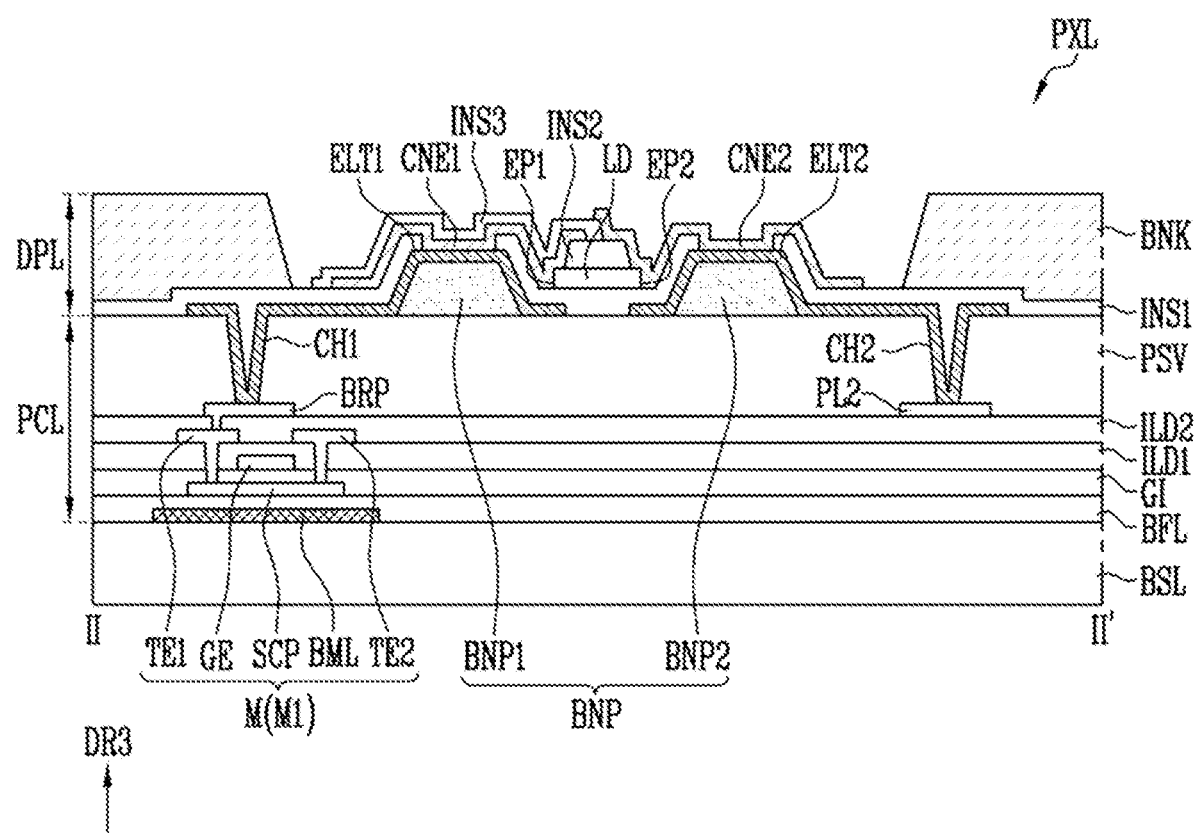
Figure 8A:
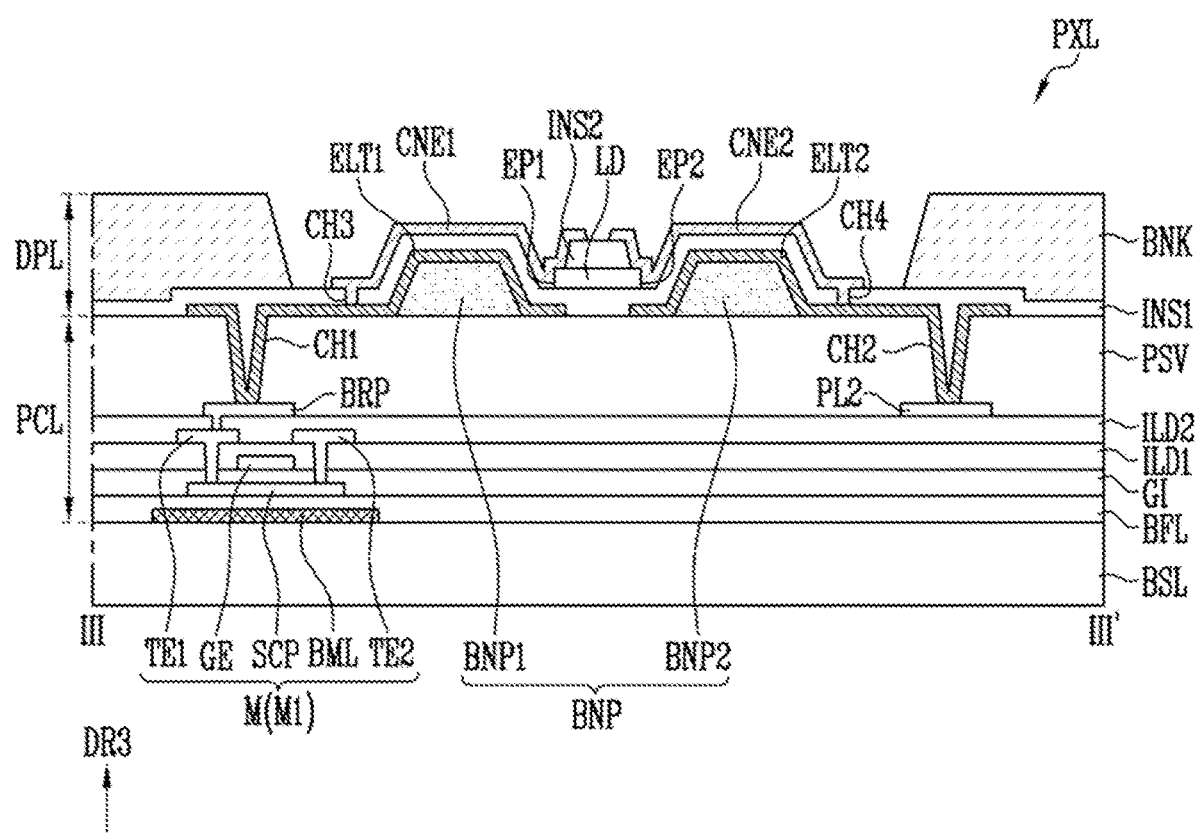
FIG. 8A and FIG. 8B respectively illustrate schematic cross-sectional views of a pixel according to an embodiment.
Figure 8B:
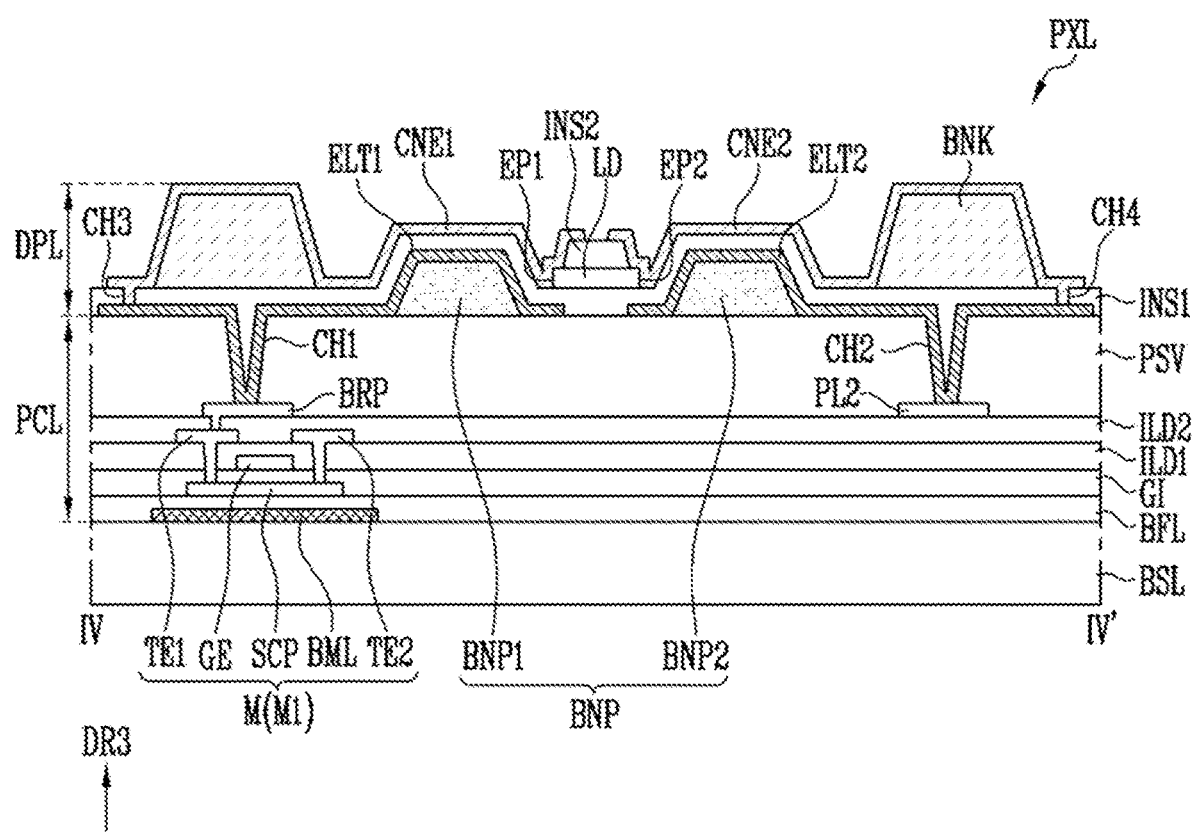

FIG. 7A and FIG. 7B, and FIG. 8A and FIG. 8B respectively illustrate a cross-sectional view of the pixel PXL according to an embodiment. For example, FIG. 7A and FIG. 7B illustrate embodiments of a cross-section of the pixel PXL taken along line II-II' of FIG. 6A. Compared with the embodiment of FIG. 7A, the embodiment of FIG. 7B further includes a third insulating layer INS3 interposed between the first contact electrode CNE1 and the second contact electrode CNE2. FIG. 8A illustrates an embodiment of a cross-section of the pixel PXL taken along line III-III' of FIG. 6B, and FIG. 8B illustrates embodiments of a cross-section of the pixel PXL taken along line IV-IV' of FIG. 6C. For example, FIG. 8A and FIG. 8B illustrate modifications of the embodiment of FIG. 7A related to connection structures between the first and second electrodes ELT1 and ELT2 and the first and second contact electrodes CNE1 and CNE2.

FIG. 7A to FIG. 8B illustrate a transistor M (for example, the first transistor M1 electrically connected to the first electrode ELT1 through the first contact hole CH1 and a bridge pattern BRP and including the bottom metal layer BML), as an example of circuit elements that may be disposed in a circuit layer PCL. As an example of a wire that may be disposed on the circuit layer PCL, the second power line PL2 electrically connected to the second electrode ELT2 through the second contact hole CH2 is illustrated.

Referring to the drawings from FIG. 3 to FIG. 8B, the pixel PXL and the display device DD including the pixel PXL according to the embodiments may include the circuit layer PCL and a display layer DPL disposed to overlap each other on a surface of a base layer BSL. For example, the display area DA may include the circuit layer PCL disposed on a surface of the base layer BSL, and the display layer DPL disposed on the circuit layer PCL. However, a mutual position of the circuit layer PCL and the display layer DPL on the base layer BSL may vary depending on embodiments.

Circuit elements (for example, the transistors M and the storage capacitor Cst) comprising the pixel circuit PXC of the corresponding pixel PXL and wires electrically connected to the circuit elements may be disposed in each pixel area PXA of the circuit layer PCL. The first and second electrodes ELT1 and ELT2, the light emitting elements LD, and/or the first and second contact electrodes CNE1 and CNE2, which comprise the light emitting unit EMU of the pixel PXL, may be disposed in each pixel area PXA of the display layer DPL.

The circuit layer PCL may include insulating layers in addition to the circuit elements and the wires. For example, the circuit layer PCL may include a buffer layer BFL, a gate insulating layer GI, a first interlayer insulating layer ILD1, a second interlayer insulating layer ILD2, and/or a passivation layer PSV, sequentially stacked on one side of the base layer BSL.

The circuit layer PCL may include a first conductive layer including at least one light blocking layer (for example, the bottom metal layer BML) disposed under at least a portion of the transistors M.

As an example, the first conductive layer may be disposed between the base layer BSL and the buffer layer BFL, and may include the bottom metal layer BML overlapping a gate electrode GE and/or a semiconductor pattern SCP of at least one transistor M.

In an embodiment, the bottom metal layer BML may be electrically connected to an electrode of the corresponding transistor M. For example, when the first transistor M1 includes the bottom metal layer BML as in the embodiments of FIG. 4 and FIG. 5, the bottom metal layer BML may be electrically connected to a source electrode (or drain electrode) of the first transistor M1.

The buffer layer BFL may be disposed on a surface of the base layer BSL including the first conductive layer. The buffer layer BFL may prevent impurities from diffusing into each circuit element.

A semiconductor layer may be disposed on the buffer layer BFL. The semiconductor layer may include the semiconductor pattern SCP of each transistor M. The semiconductor pattern SCP may include a channel area overlapping the gate electrode GE, and first and second conductive areas (for example, a source area and a drain area) disposed at respective sides of the channel area.

The semiconductor pattern SCP may be a semiconductor pattern made of polysilicon, amorphous silicon, or an oxide semiconductor. Each of the first and second conductive areas of the semiconductor pattern SCP may be doped with an impurity.

In an embodiment, the semiconductor patterns SCP of the transistors M included in each pixel circuit PXC may be made of substantially the same or similar material. For example, the semiconductor pattern SCP of the transistors M may be made of substantially the same material selected from the group including polysilicon, amorphous silicon, and an oxide semiconductor.

In another embodiment, some of the transistors M may include the semiconductor patterns SCP made of different materials. For example, the semiconductor pattern SCP of some of the transistors M may be made of polysilicon or amorphous silicon, and the semiconductor pattern SCP of the other transistors M may be made of an oxide semiconductor.

The gate insulating layer GI may be disposed on the semiconductor layer. A second conductive layer may be disposed on the gate insulating layer GI.

The second conductive layer may include the gate electrode GE of each transistor M. The second conductive layer may further include one electrode of the storage capacitor Cst and/or a wire (for example, the scan line SL).

The first interlayer insulating layer ILD1 may be disposed on the second conductive layer. A third conductive layer may be disposed on the first interlayer insulating layer ILD1.

The third conductive layer may include first and second transistor electrodes TE1 and TE2 of each transistor M. Here, the first and second transistor electrodes TE1 and TE2 may be source and drain electrodes. The third conductive layer may further include one electrode of the storage capacitor Cst and/or a wire (for example, the data line DL).

The second interlayer insulating layer ILD1 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may be formed as a single layer or as a multilayer, and may include at least one inorganic insulating material and/or organic insulating material. For example, each of the buffer layer BFL, the gate insulating layer GI, the first interlayer insulating layer ILD1, and the second interlayer insulating layer ILD2 may include organic/inorganic insulating materials such as a silicon nitride ($SiN_x$), a silicon oxide ($SiO_x$), or a silicon oxynitride ($SiO_xN_y$).

The fourth conductive layer may include the bridge pattern BRP and/or a wire (for example, the first power line PL1 and/or the second power line PL2) for connecting the circuit layer PCL and the display layer DPL. The bridge pattern BRP may be electrically connected to the first electrode ELT1 of the light emitting unit EMU through the first contact hole CH1 or the like. The second power line PL2 may be electrically connected to the second electrode ELT2 of the light emitting unit EMU through the second contact hole CH2 or the like.

Each of the conductive pattern, the electrode, and/or the wire comprising the first to fourth conductive layers may have conductivity by including at least one conductive material, but the material is not particularly limited. For example, each of the conductive pattern, the electrode, and/or the wire comprising the first to fourth conductive layers may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but the embodiments are not limited thereto.

In another embodiment, the fourth conductive layer may be omitted. The bridge pattern BRP may not be provided, and the first electrode ELT1 may be directly connected to a circuit element through the first contact hole CH1. For example, the first electrode ELT1 may be directly connected to the first transistor electrode TE1 (or the second transistor electrode TE2) of the first transistor M1 through the first contact hole CNT1.

In case that the fourth conductive layer is omitted, the second interlayer insulating layer ILD2 may be provided. For example, when the fourth conductive layer is omitted, the second interlayer insulating layer ILD2 may also be omitted, so that the passivation layer PSV may be directly formed on the third conductive layer, or even if the fourth conductive layer is omitted, the second interlayer insulating layer ILD2 and the passivation layer PSV may be sequentially formed on the third conductive layer.

The positions of the first and/or second power lines PL1 and PL2 may be modified according to embodiments. For example, when the second interlayer insulating layer ILD2 and/or the fourth conductive layer are omitted, each of the first and second power lines PL1 and PL2 may be provided to the first conductive layer, the second conductive layer, or the third conductive layer. In case that the first and/or second power lines PL1 and PL2 are provided as a multilayers, the first and/or second power lines PL1 and PL2 may include multi-layered wires provided on at least two of the first to third conductive layers (or the first to fourth conductive layers in case that the fourth conductive layer is also provided).

The passivation layer PSV may be disposed on the fourth conductive layer. In some embodiments, the passivation layer PSV may include at least one organic insulating layer, and may substantially flatten a surface of the circuit layer PCL. The display layer DPL may be disposed on the passivation layer PSV.

The passivation layer PSV may be formed as a single layer or multilayer, and may include at least one inorganic insulating material and/or organic insulating material. For example, the passivation layer PSV may include at least one organic insulating film, and may substantially flatten a surface of the circuit layer PCL. In an embodiment, the organic insulating film may be at least one of a polyacrylates resin, an epoxy resin, a phenolic resin, a polyamides resin, a polyimides rein, an unsaturated polyesters resin, a poly-phenylen ethers resin, a poly-phenylene sulfides resin, and benzocyclobutene resin, but is not limited thereto.

The display layer DPL may include the light emitting unit EMU of each pixel PXL. For example, the display layer DPL may include the first and second electrodes ELT1 and ELT2 disposed in the light emitting area EA of each pixel PXL, a plurality of light emitting elements LD arranged between the first and second electrodes ELT1 and ELT2, and the first and second contact electrodes CNE1 and CNE2 connecting the first and second electrodes ELT1 and ELT2 and the light emitting elements LD.

The display layer DPL may further include at least one pattern BNP for protruding an area of each of the first and second electrodes ELT1 and ELT2 in an upper direction, and/or the bank BNK surrounding each light emitting area EA. The display layer DPL may further include at least one conductive layer and/or an insulating layer.

For example, the display layer DPL may include the first and second patterns BNP1 and BNP2, the first and second electrodes ELT1 and ELT2, the first insulating layer INS1, the bank BNK, the light emitting elements LD, the second insulating layer INS2, and the first and second contact electrodes CNE1 and CNE2, which are sequentially disposed and/or formed on the circuit layer PCL. The display layer DPL may include the third insulating layer INS3.

In an embodiment, the first and second contact electrodes CNE1 and CNE2 may be disposed on the same layer as shown in FIG. 7A, FIG. 8A, and FIG. 8B. In another embodiment, the first and second contact electrodes CNE1 and CNE2 may be separated and disposed on different layers as shown in FIG. 7B. The display layer DPL may further include the third insulating layer INS3 interposed between the first and second contact electrodes CNE1 and CNE2. For example, the third insulating layer INS3 may cover the first contact electrode CNE1, and one end of the third insulating layer INS3 may be interposed between the first contact electrode CNE1 and the second contact electrode CNE2.

The position of the bank BNK may be changed according to embodiments in a cross-sectional view. In the embodiment, the bank BNK may be formed on the first insulating layer INS1. In another embodiment, the bank BNK may be disposed on the same layer as the first and second patterns BNP1 and BNP2. The bank BNK may be integrally or non-integrally formed with the first and/or second patterns BNP1 and BNP2, and may or may not overlap the first and/or second patterns BNP1 and BNP2.

The first and second patterns BNP1 and BNP2 (also referred to as "wall patterns" or "protruding patterns") may be formed on a surface of the base layer BSL on which the circuit layer PCL or the like is formed. The first and second patterns BNP1 and BNP2 may protrude in a height direction (for example, the third directional axis DR3) of the base layer BSL on a surface of the base layer BSL on which the circuit layer PCL is formed. The first and second patterns BNP1 and BNP2 may be disposed under the first and second electrodes ELT1 and ELT2 so as to respectively overlap portions of the first and second electrodes ELT1 and ELT2. Accordingly, the first and second electrodes ELT1 and ELT2 may upwardly protrude in an area overlapping the first and second patterns BNP1 and BNP2.

The first and second patterns BNP1 and BNP2 may form a reflective wall structure around the light emitting elements LD, and may be formed in a separate or an integral pattern. For example, the first pattern BNP1 and the second pattern BNP2 may be separated from each other. The first pattern BNP1 may be disposed under the first electrode ELT1 so as to overlap an area of the first electrode ELT1, and the second pattern BNP2 may be disposed under the second electrode ELT2 so as to overlap an area of the second electrode ELT2. In another embodiment, the first and second patterns BNP1 and BNP2 may be connected to each other while having openings or grooves corresponding to an area in which the light emitting elements LD are disposed, and may be formed in an integral pattern surrounding the area where the light emitting elements LD are disposed. The first and second patterns BNP1 and BNP2 may be different portions (or areas) of an integral pattern.

In case that the first and second patterns BNP1 and BNP2 are respectively disposed under portions of the first and second electrodes ELT1 and ELT2, the first and second electrodes ELT1 and ELT2 may protrude upward where the first and second patterns BNP1 and BNP2 are formed. Accordingly, the first and second patterns BNP1 and BNP2 may form a reflective wall structure together with the first and second electrodes ELT1 and ELT2.

For example, the first and second electrodes ELT1 and ELT2 and/or the first and second patterns BNP1 and BNP2 may be made of a reflective material, or a reflective film may be formed on protruding sidewalls of the first and second electrodes ELT1 and ELT2 and/or of the first and second patterns BNP1 and BNP2. Accordingly, the light emitted from the first and second end portions EP1 and EP2 of the light emitting elements LD facing the first and second electrodes ELT1 and ELT2 may be induced to be more directed toward a front direction of the display panel DP. Here, the front direction of the display panel DP may include a direction vertical to the display panel DP (for example, the third directional axis DR3), and it may also mean a direction included in a viewing angle range. By providing such an upwardly protruding area of the first and second electrodes ELT1 and ELT2 using the first and second patterns BNP1 and BNP2, the light efficiency of the pixel PXL may be improved.

In another embodiment, the pixel PXL may not include the first and/or second patterns BNP1 and BNP2. The first and/or second electrodes ELT1 and ELT2 may have a substantially flat surface or may have may an uneven surface formed in different thicknesses for respective areas.

The first and second patterns BNP1 and BNP2 may contain an insulating material including at least one inorganic material and/or organic material. For example, the first and second patterns BNP1 and BNP2 may include at least one layer of inorganic film that includes inorganic insulating materials such as a silicon nitride ($SiN_x$), a silicon oxide ($SiO_x$), or a silicon oxynitride ($SiO_xN_y$). In another example, the first and second patterns BNP1 and BNP2 may include at least one layer of organic film including organic insulating materials, or may include a single-layered or multi-layered insulator including organic as well as inorganic materials.

A reflective wall may be formed around the light emitting elements LD by the first and second patterns BNP1 and BNP2 and the first and second electrodes ELT1 and ELT2. For example, when the first and second electrodes ELT1 and ELT2 include a reflective electrode layer, light emitted from the first and second end portions EP1 and EP2 of the light emitting elements LD may be reflected by the reflective electrode layer to be emitted in the upper direction of each pixel PXL.

The first and second patterns BNP1 and BNP2 may have various shapes. In the embodiment, the first and second patterns BNP1 and BNP2 may be formed to have side walls inclined at an angle with respect to the base layer BSL as shown in FIG. 7A to FIG. 8B. In another embodiment, the side walls of the first and second patterns BNP1 and BNP2 may have a curved surface or a step shape. As an example, each of the first and second patterns BNP1 and BNP2 may have a semi-circular or semi-elliptical cross-section.

The first and second electrodes ELT1 and ELT2 may be disposed on upper portions of the first and second patterns BNP1 and BNP2. The first and second electrodes ELT1 and ELT2 may have surface profiles corresponding to the first and second patterns BNP1, and BNP2, and may protrude in a height direction of the base layer BSL in an area overlapping the first and second patterns BNP1 and BNP2.

Each of the first and second electrodes ELT1 and ELT2 may contain at least one conductive material. For example, the first and second electrodes ELT1 and ELT2 may include at least one metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO); and at least one conductive material among conductive polymers such as PEDOT, but are not limited thereto. For example, the first and second electrodes ELT1 and ELT2 may contain other conductive materials in addition to carbon nanotube or graphene. The first and second electrodes ELT1 and ELT2 may have conductivity by including at least one of a variety of conductive materials, and the material included in the first and second electrodes ELT1 and ELT2 is not particularly limited. The first and second electrodes ELT1 and ELT2 may include the same conductive materials or include different conductive materials.

Each of the first and second electrodes ELT1 and ELT2 may be comprised of a single layer or multilayer. For example, the first and second electrodes ELT1 and ELT2 may include a reflective electrode layer including a reflective conductive material, such as a metal. The first and second electrodes ELT1 and ELT2 may further include at least one of a transparent electrode layer disposed at upper and/or lower portions of the reflective electrode layer and a conductive capping layer covering upper portions of the reflective electrode layer and/or the transparent electrode layer.

The first insulating layer INS1 may be disposed on the first and second electrodes ELT1 and ELT2. For example, the first insulating layer INS1 may be formed to cover an area of the first and second electrodes ELT1 and ELT2, and may include an opening exposing an area of the first and second electrodes ELT1 and ELT2. For example, the first insulating layer INS1 may include openings formed on upper surfaces of the first and second patterns BNP1 and BNP2 as shown in FIG. 7A and FIG. 7B. The first and second contact electrodes CNE1 and CNE2 may contact and be electrically connected to the first and second electrodes ELT1 and ELT2 through the openings. In another embodiment, the first insulating layer INS1 may include the third and fourth contact holes CH3 and CH4 for respectively connecting the first and second electrodes ELT1 and ELT2 to the first and second contact electrodes CNE1 and CNE2 as shown in FIG. 8A and FIG. 8B.

The first insulating layer INS1 may be formed as a single layer or a multilayer, and may include at least one inorganic insulating material and/or organic insulating material. In the embodiment, the first insulating layer INS1 may include at least one layer of inorganic insulating film including at least one type of inorganic insulating material in addition to a silicon nitride ($SiN_x$), a silicon oxide ($SiO_x$), or a silicon oxynitride ($SiO_xN_y$).

In an area in which the first insulating layer INS1 is opened (or an area in which the third and fourth contact holes CH3 and CH4 are formed in the first insulating layer INS1), the first and second electrodes ELT1 and ELT2 may be electrically connected to the first and second contact electrodes CNE1 and CNE2, respectively.

As the first and second electrodes ELT1 and ELT2 are covered by the first insulating layer INS1, it is possible to prevent the first and second electrodes ELT1 and ELT2 from being damaged in a subsequent process. It is possible to prevent a short circuit defects caused by the first and second electrodes ELT1 and ELT2 and the light emitting elements LD being improperly connected to each other.

The light emitting elements LD may be supplied and arranged in the light emitting area EA in which the first insulating layer INS1 or the like is formed. Each light emitting element LD may be aligned between the first electrode ELT1 and the second electrode ELT2 so as to overlap or not overlap the first electrode ELT1 and/or the second electrode ELT2.

Before the light emitting elements LD are supplied, the bank BNK may be formed around the light emitting area EA. For example, the bank BNK may be formed in the display area DA to surround each light emitting area EA, and may define each light emitting area EA where the light emitting elements LD are to be supplied.

The second insulating layer INS2 may be disposed on an area of the light emitting elements LD. For example, the second insulating layer INS2 may be locally disposed on one area of each of the light emitting elements LD to expose the first and second end portions EP1 and EP2 of the light emitting elements LD. The second insulating layer INS2 may be formed in an independent pattern in the light emitting area EA of each pixel PXL, but the embodiments are not limited thereto.

The second insulating layer INS2 may be formed as a single layer or multilayer, and may include at least one inorganic insulating material and/or organic insulating material. For example, the second insulating layer INS2 may include a silicon nitride ($SiN_x$), a silicon oxide ($SiO_x$), a silicon oxynitride ($SiO_xN_y$), an aluminum oxide ($Al_xO_y$), or a photo resist (PR) material, and organic/inorganic insulating materials.

In case that the second insulating layer INS2 is formed on the light emitting elements LD after the alignment of the light emitting elements LD is completed, the light emitting elements LD may be secured by the second insulating layer INS2.

In an embodiment, when a separating space exists between the first insulating layer INS1 and the light emitting elements LD by a step formed by the first and second electrodes ELT1 and ELT2, at least a portion of the separating space forms the second insulating layer INS2 may be filled with an insulating material introduced in a process of forming the second insulating layer INS2. However, in some embodiments, the separating space may not be completely filled.

Both end portions of the light emitting elements LD that are not covered by the second insulating layer INS2, that is, the first and second end portions EP1 and EP2, may be covered by the first and second contact electrodes CNE1 and CNE2, respectively.

The first and second contact electrodes CNE1 and CNE2 may be formed to be separate from each other. For example, the first and second contact electrodes CNE1 and CNE2 may be spaced apart from each other on the first and second end portions EP1 and EP2 of at least one light emitting element LD, with the second insulating layer INS2 therebetween.

The first and second contact electrodes CNE1 and CNE2 may be disposed at the upper portion of the first and second electrodes ELT1 and ELT2 to cover the exposed area (or the third and fourth contact holes CH3 and CH4) of each of the first and second electrodes ELT1 and ELT2. For example, the first and second contact electrodes CNE1 and CNE2 may be disposed on the first and second electrodes ELT1 and ELT2 so as to electrically contact the first and second electrodes ELT1 and ELT2 on or around the first and second patterns BNP1 and BNP2, as shown in FIG. 7A and FIG. 7B.

In another example, as shown in FIG. 8A and FIG. 8B, the first and second contact electrodes CNE1 and CNE2 may be disposed on the first and second electrodes ELT1 and ELT2 so as to respectively overlap the third and fourth contact holes CH3 and CH4 to be respectively electrically connected to the first and second electrodes ELT1 and ELT2 by the third and fourth contact holes CH3 and CH4. In the embodiment, the formation positions of the third and fourth contact holes CH3 and CH4 may be selected in consideration of the light efficiency of the pixel PXL, and the first and second contact electrodes CNE1 and CNE2 may be respectively electrically connected to the first and second electrodes ELT1 and ELT2 by the third and fourth contact holes CH3 and CH4.

Accordingly, the first and second contact electrodes CNE1 and CNE2 may be respectively electrically connected to the first and second electrodes ELT1 and ELT2. Through the first and second contact electrodes CNE1 and CNE2, the first and second electrodes ELT1 and ELT2 may be respectively electrically connected to the first or second end portions EP1 and EP2 of at least one adjacent light emitting element LD.

In case that the first and second contact electrodes CNE1 and CNE2 are formed on the same layer as in the embodiment of FIG. 7A, the first and second contact electrodes CNE1 and CNE2 may be simultaneously or sequentially formed in the same process, and the third insulating layer INS3 may be omitted. It may be possible to simplify the manufacturing process of the pixels PXL.

As in the embodiment of FIG. 7B, in case that the first and second contact electrodes CNE1 and CNE2 are formed in different layers with the third insulating layer INS3 interposed therebetween, the first and second contact electrodes CNE1 and CNE2 may be further stably separated.

In another embodiment, at least one of the first and second contact electrodes CNE1 and CNE2 may be omitted. In this case, the first and/or second end portions EP1 and EP2 of the light emitting elements LD may directly contact and/or be directly connected to the first and/or second electrodes ELT1 and ELT2.

The third insulating layer INS3 may be formed as a single layer or multilayer, and may include at least one inorganic insulating material and/or organic insulating material. In an embodiment, the third insulating layer INS1 may include at least one layer of inorganic insulating film including at least one type of inorganic insulating material in addition to a silicon nitride ($SiN_x$), a silicon oxide ($SiO_x$), or a silicon oxynitride ($SiO_xN_y$).

In case that the second and/or third insulating layers INS2 and INS3 are formed on the upper portion of the light emitting elements LD, electrical stability between the first and second end portions EP1 and EP2 of the light emitting elements LD may be enhanced. Accordingly, it may be possible to prevent short circuit defects from occurring between the first and second end portions EP1 and EP2 of the light emitting elements LD.

In an embodiment, the first and second contact electrodes CNE1 and CNE2 may be made of transparent conductive materials. For example, the first and second contact electrodes CNE1 and CNE2 may include at least one of transparent materials such as an indium tin oxide (ITO), an indium zinc oxide (IZO), an indium tin zinc oxide (ITZO), a zinc oxide (ZnO), an aluminum doped zinc oxide (AZO), a gallium doped zinc oxide (GZO), a zinc tin oxide (ZTO), a gallium tin oxide (GTO), and a fluorine doped tin oxide (FTO), and they may be implemented to be substantially transparent or translucent to satisfy a predetermined transmittance. Accordingly, the light emitted from the light emitting elements LD through each of the first and second ends EP1 and EP2 may pass through the first and second contact electrodes CNE1 and CNE2 to be emitted to the outside of the display panel DP.

At least one insulating layer and/or a light conversion layer, not shown, may be provided on the first and second contact electrodes CNE1 and CNE2 and/or the third insulating layer INS3. For example, in the third insulating layer INS3, an insulating layer may be entirely formed on the display area DA to cover the first and second patterns BNP1 and BNP2, the first and second electrodes ELT1 and ELT2, the first insulating layer INS1, the bank BNK, the light emitting elements LD, the second insulating layer INS2, the first and second contact electrodes CNE1 and CNE2, and/or the third insulating layer INS3.

The insulating layer may include at least one layer of an inorganic film and/or organic film. For example, the insulating layer may be formed as a single layer or multilayer, and may include at least one inorganic insulating material and/or organic insulating material. For example, the insulating layer may include a silicon nitride ($SiN_x$), a silicon oxide ($SiO_x$), a silicon oxynitride ($SiO_xN_y$), or an aluminum oxide ($Al_xO_y$), and organic/inorganic insulating materials.

In an embodiment, the insulating layer may include a single-layered (or multi-layered) encapsulation layer. In some embodiments, at least one of overcoat layer, filler layer, and/or upper substrate may be further disposed on the insulating layer.

A light conversion layer may be provided on the light emitting unit EMU of each pixel PXL. The light conversion layer may include a color conversion layer (or wavelength conversion layer) and/or a color filter layer corresponding to a predetermined color. The light conversion layer may be directly formed on the first and second contact electrodes CNE1 and CNE2 and/or the third insulating layer INS3 of each pixel PXL, or may be formed on the insulating layer covering the first and second contact electrodes CNE1 and CNE2 and/or the third insulating layer INS3, and the type, structure, position, and formation method of the light conversion layer are not particularly limited.

For example, in each pixel area PXA, light conversion particles (for example, quantum dots of a predetermined color) for converting a color (or wavelength) of light emitted from the light emitting elements LD, light scattering particles for increasing a utilization rate of the light emitted from the light emitting elements LD, and/or a light conversion layer containing a color filter material of a predetermined color may be provided on the upper portion of the display layer DPL.

Figure 13:
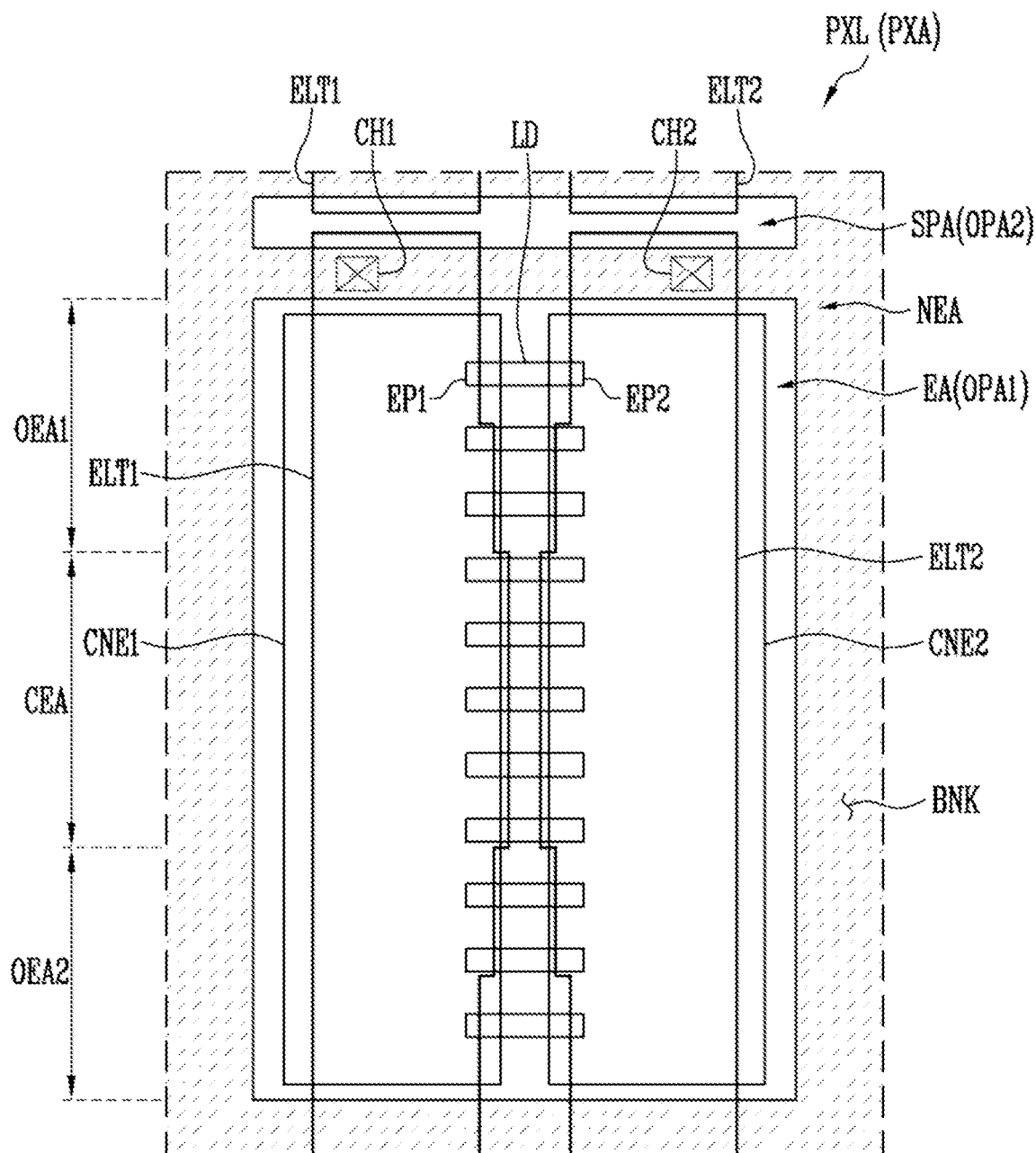
Figure 14:
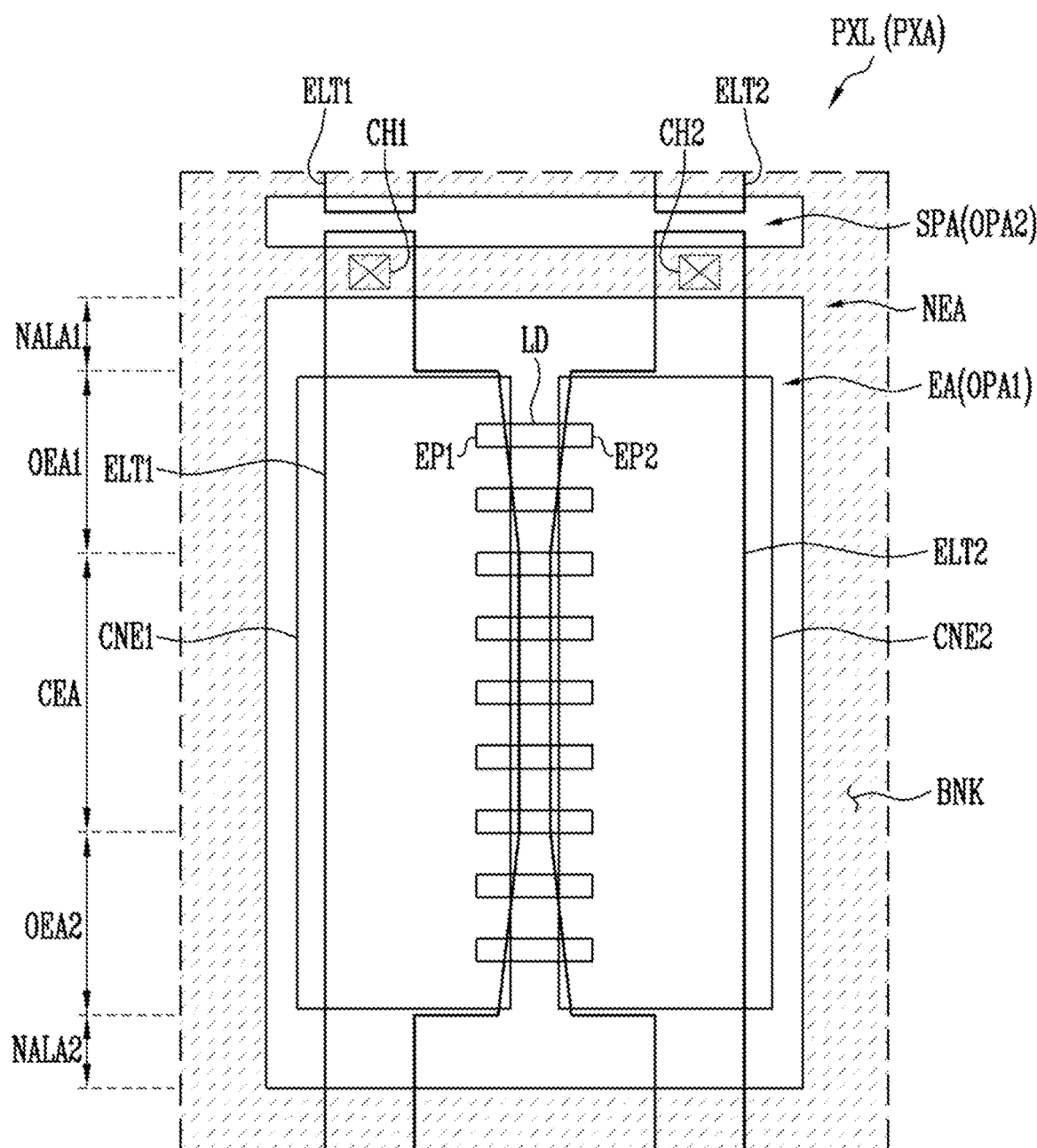
Figure 15:
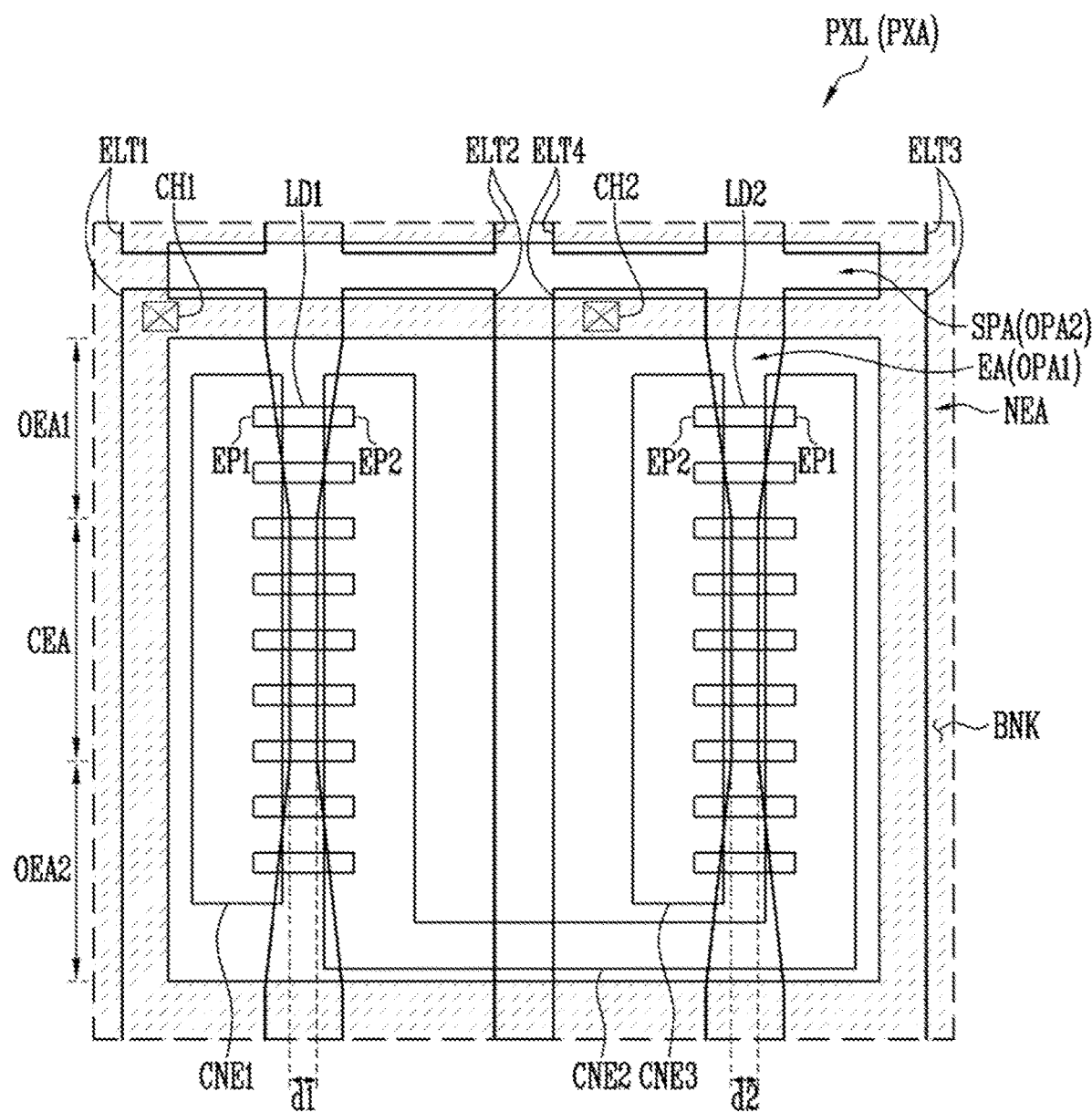

FIG. 9 to FIG. 15 respectively illustrate a top plan view of the pixel PXL according to an embodiment. For example, FIG. 9 to FIG. 14 illustrate different modified embodiments of the embodiment of FIG. 6A in relation to the shape and/or size of the first and second electrodes ELT1 and ELT2. FIG. 15 illustrates a modified embodiment of FIG. 6A in relation to the light emitting unit EMU, and for example, it illustrates an embodiment of the pixel PXL including the light emitting unit EMU having a serial/parallel structure as in the embodiment of FIG. 5. In describing the embodiments of FIG. 9 to FIG. 15, the same reference numerals are denoted to similar or identical items to embodiments described above, and detailed descriptions will be not be repeated.

Figure 9:
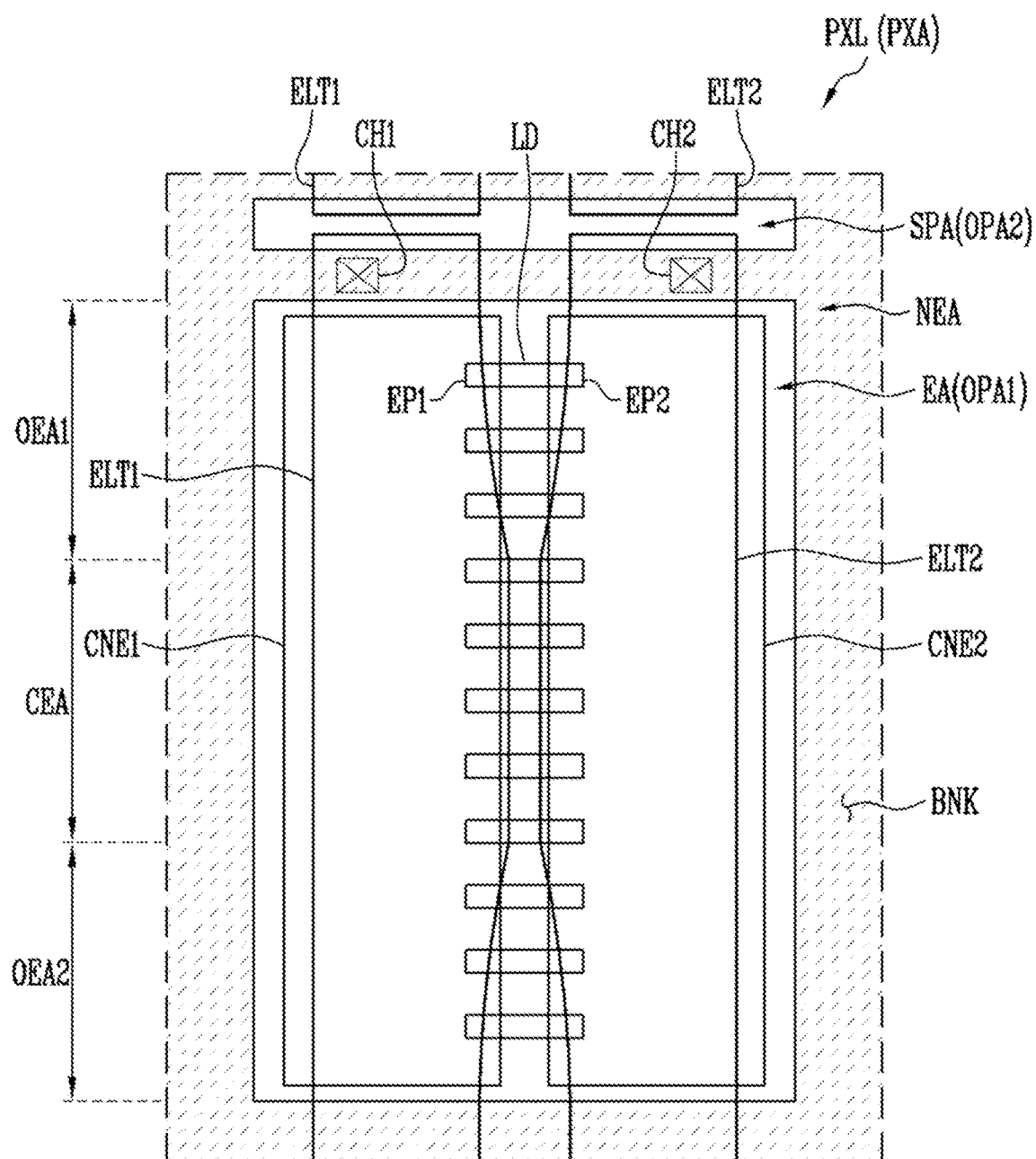
FIG. 9 to FIG. 15 respectively illustrate schematic plan views of a pixel according to an embodiment.
Figure 10:
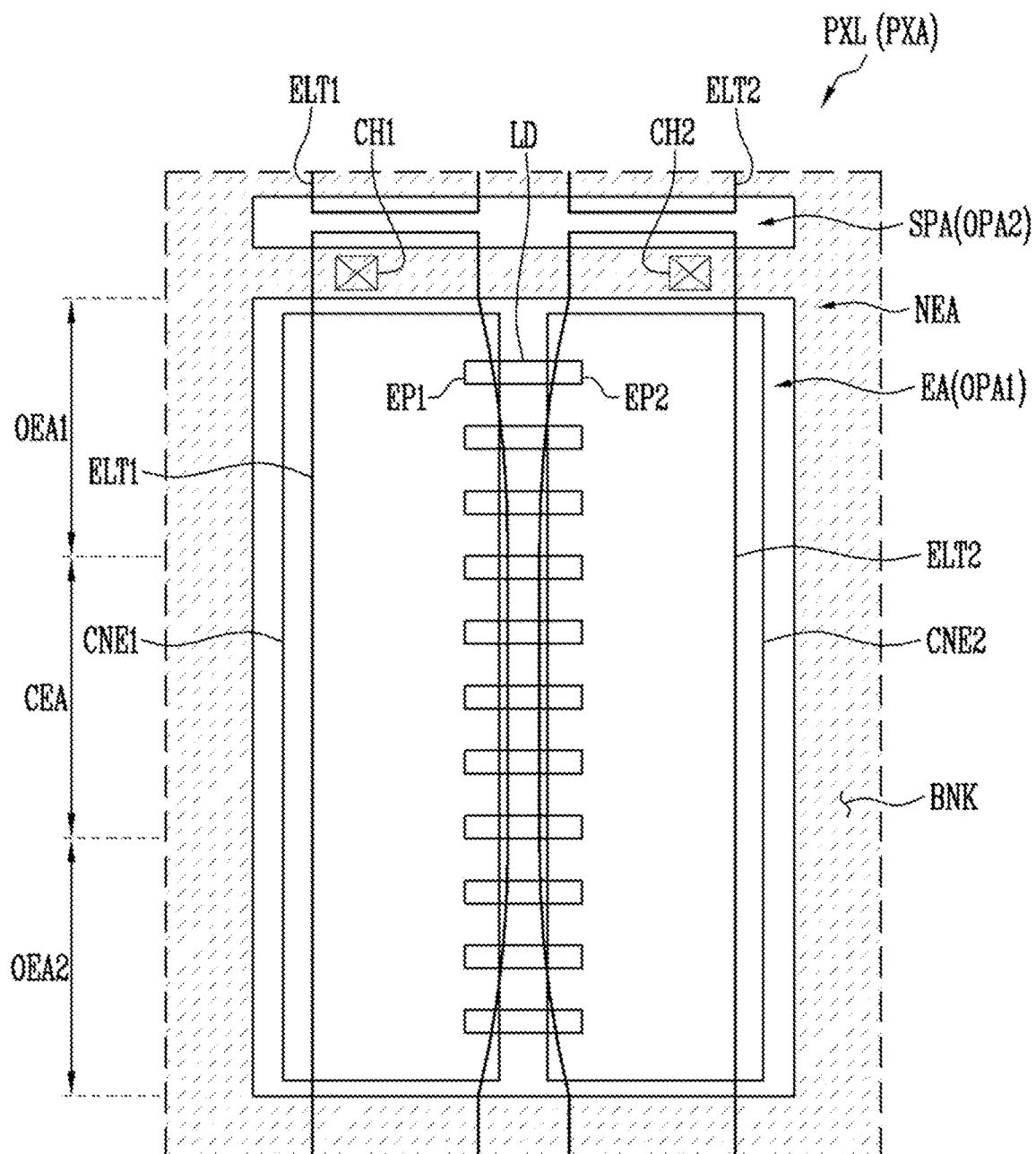

Referring to FIG. 9 and FIG. 10, the first electrode ELT1 and the second electrode ELT2 may be spaced apart from each other with a nonlinearly and/or continuously increasing interval (or distance) in the outer portions OEA (OEA1 and OEA2) of the light emitting area EA. For example, the first electrode ELT1 and second electrode ELT2 may be formed so that respective surfaces facing each other in the outer portions OEA (OEA1 and OEA2) of the light emitting area EA have concave curved shapes as shown in FIG. 9 or convex curved shapes as shown in FIG. 10. The first electrode ELT1 and the second electrode ELT2 may be spaced apart from each other at a gradually increasing interval (or distance) as first and second electrodes ELT1 and ELT2 are farther away from the central portion CEA.

Figure 11:
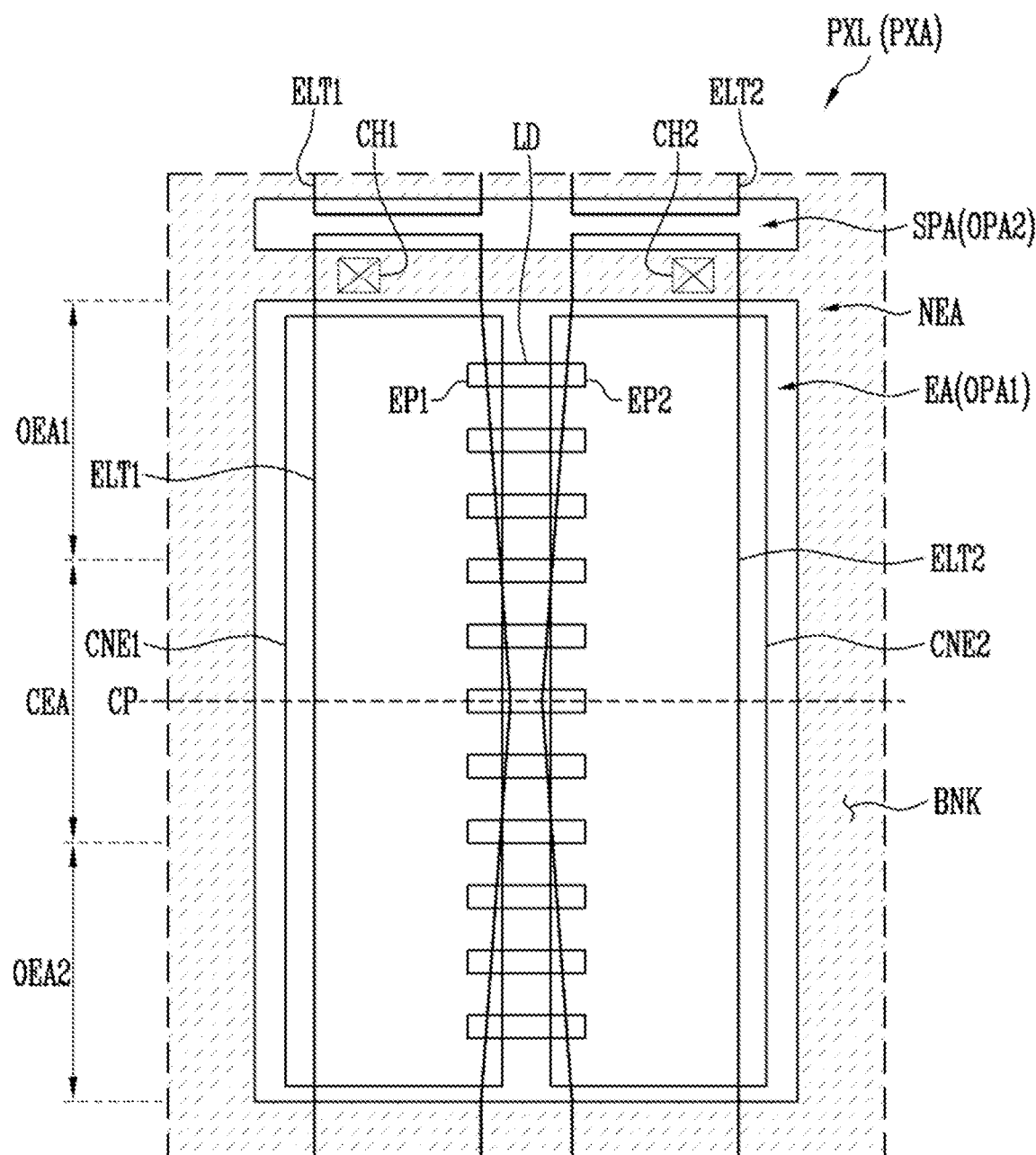
Figure 12:
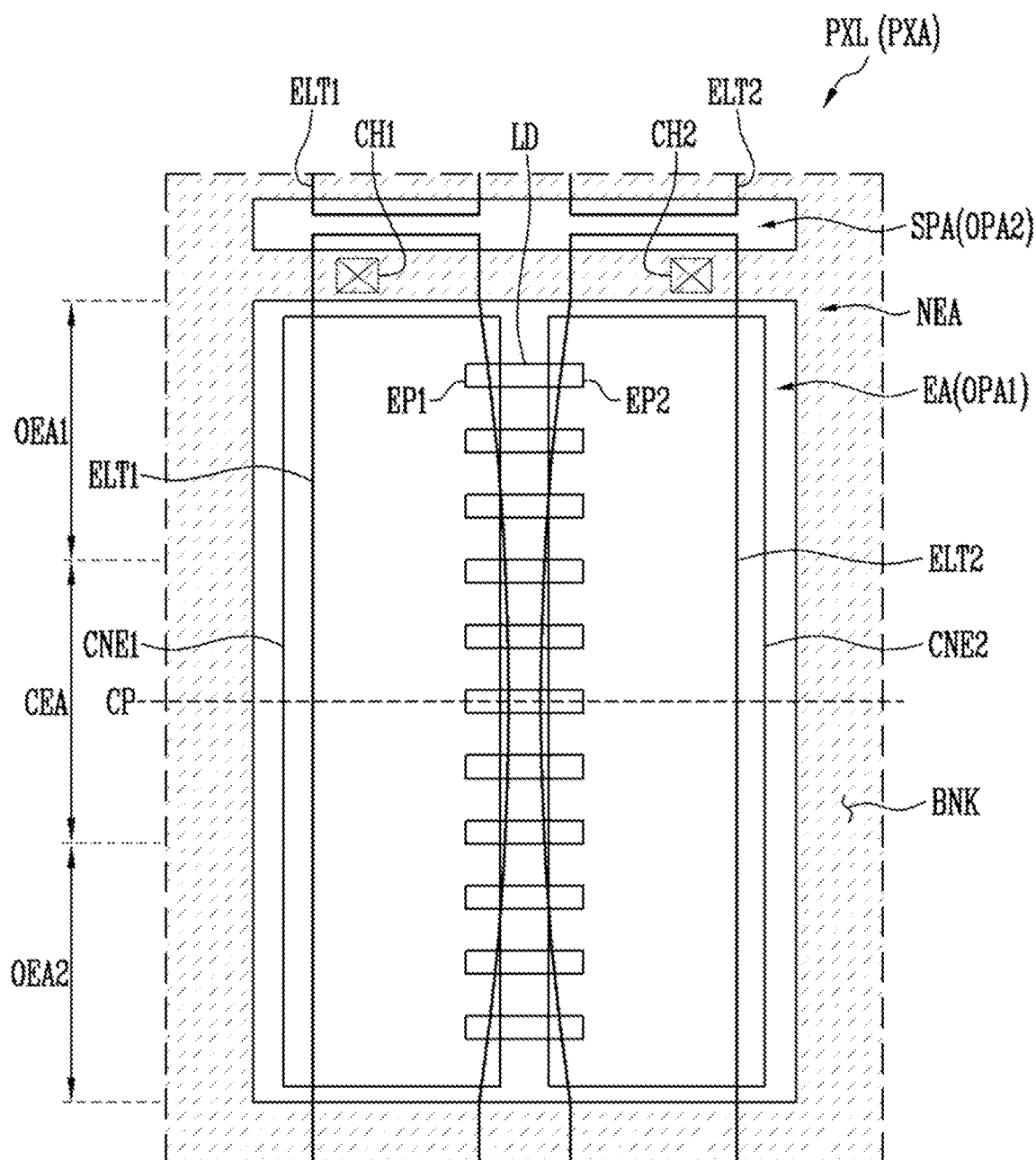

Referring to FIG. 11 and FIG. 12, the first electrode ELT1 and the second electrode ELT2 may be spaced apart from each other with an interval gradually increasing as they are farther away from the central point CP even in the central portion CEA of the light emitting area EA. For example, the first electrode ELT1 and the second electrode ELT2 may be spaced apart from each other by a minimum interval at the central point CP, and may be spaced apart from each other at a gradually increasing interval (or distance) as they are farther away from the central point CP. For example, the first electrode ELT1 and the second electrode ELT2 may be formed so that respective surfaces facing each other in the light emitting area EA have diagonal shapes having a constant inclination around the center point CP as shown in FIG. 11, or have curved shapes having a constant curvature around the central point CP as shown in FIG. 12. The first electrode ELT1 and the second electrode ELT2 may be spaced apart from each other at a continuously increasing interval (or distance) as they are farther away from the central point CP.

In another embodiment, the first electrode ELT1 and/or the second electrode ELT2 may be formed so that respective surfaces facing each other in the light emitting area EA have at least one inflection point.

Referring to FIG. 13, the first electrode ELT1 and the second electrode ELT2 may be spaced apart from each other with intervals (or distances) that change discontinuously in the outer portions OEA (OEA1 and OEA2) of the light emitting area EA. For example, in the first electrode ELT1 and the second electrode ELT2, respective surfaces facing each other in the outer portions OEA (OEA1 and OEA2) of the light emitting area EA may have step-like shapes, and the first electrode ELT1 and the second electrode ELT2 may be spaced apart from each other at an interval (or distance) that increases as they are farther away from the central portion CEA.

Referring to FIG. 14, the light emitting area EA may further include an unaligned areas NALA disposed between the outer portions OEA (OEA1 and OEA2) and the non-light emitting area NEA. For example, the light emitting area EA may include a first unaligned area NALA1 disposed between the first outer portion OEA1 and the non-light emitting area NEA, and a second unaligned area NALA2 disposed between the second outer portion OEA2 and the non-light emitting area NEA. The unaligned areas NALA may be an outermost area of the light emitting area EA in the second directional axis DR2. For example, the unaligned area NALA may be an upper area and a lower area of the light emitting area EA, and may extend to the non-light emitting area NEA.

The first electrode ELT1 and the second electrode ELT2 may be formed so that the light emitting elements LD are not aligned and/or connected to each other in the unaligned area NALA. For example, the first electrode ELT1 and the second electrode ELT2 may be spaced apart from each other at a relatively large interval in the unaligned area NALA compared with the central portion CEA and the outer portions OEA (OEA1 and OEA2), and they may be spaced apart from each other with a large interval (or distance) such that it may be difficult to align and/or connect light emitting elements LD in the unaligned area NALA. For example, the first electrode ELT1 and the second electrode ELT2 each have a reduced width and/or a curved structure in the unaligned area NALA, so that they may be spaced apart from each other at an interval (or distance) such that it is difficult to properly align and connect the light emitting elements LD in that area.

Referring to FIG. 15, the pixel PXL may include the first to fourth electrodes ELT1 to ELT4 that are disposed to be spaced apart from each other in the light emitting area EA. As an example, the first to fourth electrodes ELT1 to ELT4 may be disposed to be spaced apart from each other at a predetermined interval (or distance) with respect to the first directional axis DR1 in the light emitting area EA.

The first electrode ELT1 and the second electrode ELT2 may be disposed to be adjacent to each other in pairs, and may receive different alignment signals in the alignment step of the light emitting elements LD. Accordingly, at least one first light emitting element LD1 (for example, a plurality of first light emitting elements LD1) may be disposed and/or aligned between the first electrode ELT1 and the second electrode ELT2.

The first electrode ELT1 and the second electrode ELT2 are spaced apart from each other by the first distance d1 in the central portion CEA of the light emitting area EA, and are spaced apart from each other by a distance larger than the first distance d1 in the outer portions OEA (OEA1 and OEA2) of the light emitting area EA, and they may be spaced apart from each other by an interval (or distance) gradually increasing as they are farther away from the central portion CEA. Accordingly, the first light emitting elements LD1 between the first electrode ELT1 and the second electrode ELT2 may be prevented from being concentrated in the outer part of the light emitting area EA, and the utilization rate and alignment characteristics of the first light emitting elements LD1 may be improved.

The third electrode ELT3 and the fourth electrode ELT4 may be disposed to be adjacent to each other in pairs, and may receive different alignment signals in the alignment step of the light emitting elements LD. Accordingly, at least one second light emitting element LD2 (for example, second light emitting elements LD2) may be disposed and/or aligned between the third electrode ELT3 and the fourth electrode ELT4.

The third electrode ELT3 and the fourth electrode ELT4 are spaced apart from each other by the second distance d2 in the central portion CEA of the light emitting area EA, and are spaced apart from each other by a distance larger than the second distance d2 in the outer portions OEA (OEA1 and OEA2) of the light emitting area EA, and in this case, they may be spaced apart from each other by an interval (or distance) gradually increasing as they are farther away from the central portion CEA. Accordingly, the second light emitting elements LD2 between the third electrode ELT3 and the fourth electrode ELT4 may be prevented from being concentrated in the outer part of the light emitting area EA, and the utilization rate and alignment characteristics of the second light emitting elements LD2 may be improved.

In an embodiment, the first interval d1 and the second interval d2 may be equal to each other. By allowing the intensity of the electric field formed between the first electrode ELT1 and the second electrode ELT2 and between the third electrode ELT3 and the fourth electrode ELT4 to be uniform, the light emitting elements LD may be more uniformly aligned in the light emitting area EA.

However, the embodiments are not limited thereto. In an embodiment, the first interval d1 and the second interval d2 may be set differently in order to adjust the alignment and distribution characteristics of light emitting elements LD in a desired shape.

Each of the first, second, third, and fourth electrodes ELT1, ELT2, ELT3, and ELT4 may or may not overlap the bank BNK, and the size, shape, and/or position of each of the first, second, third and fourth electrodes ELT1, ELT2, ELT3, and ELT4 may be modified depending on the design conditions of the pixel PXL. For example, the first electrode ELT1 may not overlap the bank BNK in the first directional axis DR1 as shown in FIG. 6A to 14, or may overlap the bank BNK in the first directional axis DR1 as shown in FIG. 15.

The pixel PXL may further include the first to third contact electrodes CNE1 to CNE3 for stably connecting the first and second light emitting elements LD1 and LD2 between the first to fourth electrodes ELT1 to ELT4.

The first contact electrode CNE1 may be disposed on the first electrode ELT1 and the first end portions EP1 of the first light emitting elements LD1, and may electrically connect the first electrode ELT1 to the first end portions EP1 of the first light emitting elements LD1.

The second contact electrode CNE2 may be disposed on the second electrode ELT2, the second end portions EP2 of the first light emitting elements LD1, the third electrode ELT3, and the first end portions EP1 of the second light emitting elements LD2, and may electrically connect the second electrode ELT2, the second end portions EP2 of the first light emitting elements LD1, the third electrode ELT3, and the first end portions EP1 of the second light emitting elements LD2.

The third contact electrode CNE3 may be disposed on the fourth electrode ELT4 and the second end portions EP2 of the second light emitting elements LD2, and may electrically connect the fourth electrode ELT4 and the second end portions EP2 of the second light emitting elements LD2.

Each of the first, second, and third contact electrodes CNE1, CNE2, and CNE3 may have the same width as or different widths from that of the first, second, third and fourth electrodes ELT1, ELT2, ELT3, and ELT4, and the size, shape, and/or position of each of the first, second, and third contact electrodes CNE1, CNE2, and CNE3 may be modified according to design conditions of the pixel PXL. For example, the first contact electrode CNE1 may have a width larger than that of the first electrode ELT1 as shown in FIG. 6A to FIG. 14, or may have a width smaller than that of the first electrode ELT1 as shown in FIG. 15.

According to the pixel PXL and the display device DD including the pixel PXL according to the embodiments, by gradually increasing the interval between the first electrode ELT1 and the second electrode ELT2 in the outer portions OEA (OEA1 and OEA2) of the light emitting area EA, it is possible to prevent the phenomenon that the light emitting elements LD are concentrated in the outer portions OEA (OEA1 and OEA2) of the light emitting area EA due to the ACEO effect, and it is possible to more stably align the light emitting elements LD between the first electrode ELT1 and the second electrode ELT2. Accordingly, the utilization rate and alignment characteristic of the light emitting elements LD may be improved, and the light emitting characteristic and luminance of the pixel PXL may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A pixel comprising:
   a light emitting area including a central portion and an outer portion;
   a non-light emitting area surrounding the light emitting area;
   a first electrode and a second electrode that are spaced apart from each other in the light emitting area; and
   a first light emitting element disposed between the first electrode and the second electrode, wherein
   the first electrode and the second electrode are spaced apart from each other at a first interval in the central portion,
   the first electrode and the second electrode are spaced apart from each other at a second interval in the outer portion, the second interval being larger than the first interval, and
   an interval between the first electrode and the second electrode gradually increases from the central portion to the outer portion.

2. The pixel of claim 1, wherein
   the second interval between the first electrode and the second electrode linearly increases in the outer portion.

3. The pixel of claim 1, wherein
   the second interval between the first electrode and the second electrode nonlinearly increases in the outer portion.

4. The pixel of claim 1, wherein
   the second interval between the first electrode and the second electrode varies discontinuously between different locations in the outer portion.

5. The pixel of claim 1, wherein
   the first electrode and the second electrode have shapes that are symmetrical to each other with respect to the first light emitting element.

6. The pixel of claim 1, wherein
   the first electrode and the second electrode have shapes that are symmetrical to each other with respect to the central portion.

7. The pixel of claim 1, wherein
   the first electrode and the second electrode have shapes that are symmetrical to each other with respect to the first light emitting element, and
   each of the first electrode and the second electrode has a vertically symmetrical shape with respect to the central portion.

8. The pixel of claim 1, wherein
   the first electrode and the second electrode have surfaces facing each other that have diagonal shapes, curved shapes, or step-like shapes.

9. The pixel of claim 1, wherein
   the first electrode and the second electrode are spaced apart from each other in a first direction in the light emitting area, and extend in a second direction.

10. The pixel of claim 9, wherein
the first electrode and the second electrode are spaced apart from each other by the first interval in the first direction in the central portion,
the first electrode and the second electrode are spaced apart from each other by the second interval in the first direction in the outer portion, and
an interval between the first electrode and the second electrode in the first direction gradually increases from the central portion to the outer portion.

11. The pixel of claim 9, wherein the central portion includes:
an area corresponding to a central point of the light emitting area in the second direction; and
an area extending from the central point toward the outer portion.

12. The pixel of claim 11, wherein
the first interval between the first electrode and the second electrode has a uniform distance in the central portion.

13. The pixel of claim 11, wherein
the first interval between the first electrode and the second electrode gradually increases from the central point of the light emitting area.

14. The pixel of claim 11, wherein
the first electrode and the second electrode have surfaces, respectively, facing each other, and have constant slopes or curvatures around the central point of the light emitting area on the surfaces of the first electrode and the second electrode facing each other, and
the first electrode and the second electrode are spaced apart from each other at a continuously increasing interval.

15. The pixel of claim 1, wherein
the light emitting area includes an unaligned area disposed between the outer portion and the non-light emitting area,
the first electrode and the second electrode are farther spaced apart from each other in the unaligned area than in the central portion and the outer portion, and
the first electrode and the second electrode each has a reduced width in the unaligned area.

16. The pixel of claim 1, wherein
the first light emitting element is electrically connected between the first electrode and the second electrode.

17. The pixel of claim 16, further comprising
a third electrode and a fourth electrode that are spaced apart from each other in the light emitting area and are separated from the first electrode and the second electrode; and
a second light emitting element disposed between the third electrode and the fourth electrode.

18. The pixel of claim 17, wherein
the third electrode and the fourth electrode are spaced apart from each other at a third interval in the central portion, and
the third electrode and the fourth electrode are spaced apart from each other at a fourth interval in the outer portion, the fourth interval being larger than the third interval, and
an interval between the third electrode and the fourth electrode gradually increases from the central portion to the outer portion.

19. The pixel of claim 17, further comprising:
a first contact electrode electrically connecting the first electrode and a first end portion of the first light emitting element;
a second contact electrode electrically connecting the second electrode, a second end portion of the first light emitting element, the third electrode, and a first end portion of the second light emitting element; and
a third contact electrode electrically connecting the fourth electrode and a second end portion of the second light emitting element.

20. A display device comprising:
a pixel disposed in a display area, wherein
the pixel includes:
a light emitting area including a central portion and an outer portion;
a non-light emitting area surrounding the light emitting area;
a first electrode and a second electrode that are spaced apart from each other in the light emitting area; and
a first light emitting element disposed between the first electrode and the second electrode,
the first electrode and the second electrode are spaced apart from each other at a first interval in the central portion,
the first electrode and the second electrode are spaced apart from each other at a second interval in the outer portion, the second interval being larger than the first interval, and an interval between the first electrode and the second electrode gradually increases from the central portion to the outer portion.

* * * * *